United States Patent
Kasztenny et al.

(10) Patent No.: US 10,288,688 B2
(45) Date of Patent: May 14, 2019

(54) SYSTEMS AND METHODS FOR MONITORING AND PROTECTING AN ELECTRIC POWER GENERATOR

(71) Applicant: Schweitzer Engineering Laboratories, Inc., Pullman, WA (US)

(72) Inventors: Bogdan Z. Kasztenny, Markham (CA); Normann Fischer, Colfax, WA (US); Dale S. Finney, Little Bras D'or (CA); Douglas I. Taylor, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 694 days.

(21) Appl. No.: 14/807,339

(22) Filed: Jul. 23, 2015

(65) Prior Publication Data

US 2016/0025811 A1    Jan. 28, 2016

Related U.S. Application Data

(60) Provisional application No. 62/028,689, filed on Jul. 24, 2014.

(51) Int. Cl.
  *G01R 31/34* (2006.01)
  *H02H 7/06* (2006.01)
  *H02H 3/08* (2006.01)

(52) U.S. Cl.
  CPC .......... *G01R 31/343* (2013.01); *H02H 7/06* (2013.01); *H02H 3/083* (2013.01)

(58) Field of Classification Search
  None
  See application file for complete search history.

(56) References Cited

U.S. PATENT DOCUMENTS

| | | |
|---|---|---|
| 2,881,319 A | 4/1959 | Sills |
| 3,727,123 A | 4/1973 | Smith |
| 3,973,171 A | 8/1976 | Howell |
| 4,000,464 A | 12/1976 | Nussel |
| 4,001,646 A | 1/1977 | Howell |
| 4,029,951 A | 6/1977 | Berry |

(Continued)

FOREIGN PATENT DOCUMENTS

| | | | | |
|---|---|---|---|---|
| CN | 203324449 U | * 12/2013 | ............. | G01R 31/34 |
| JP | 52022422 | 9/1978 | | |

(Continued)

OTHER PUBLICATIONS

Farong et al, CN 203324449, "Electricity Generator Fault Detecting Device" (English Machine Translation, Dec. 4, 2013).*

(Continued)

*Primary Examiner* — Melissa J Koval
*Assistant Examiner* — Courtney G McDonnough
(74) *Attorney, Agent, or Firm* — Justin K. Flanagan; Bradley W. Schield

(57) ABSTRACT

Protection of an electrical generator includes determining a rotor and stator components using rotor and stator electrical signals, calculating a unbalance and/or differential component using the stator and rotor components, and determining a stator or rotor fault based on the unbalance and/or differential component. Further, the faulted phase and/or zone of a stator fault may be determined using the stator positive sequence voltage and negative sequence current.

22 Claims, 31 Drawing Sheets

(56) References Cited

U.S. PATENT DOCUMENTS

| | | | |
|---|---|---|---|
| 4,066,950 A | | 1/1978 | Rumold |
| 4,088,935 A | * | 5/1978 | D'Atre .................. H02P 23/08 318/740 |
| 4,148,087 A | | 4/1979 | Phadke |
| 4,156,186 A | * | 5/1979 | Wolfinger ............ G01R 31/343 324/108 |
| 4,159,499 A | | 6/1979 | Breskin |
| 4,161,011 A | | 7/1979 | Wilkinson |
| 4,206,398 A | | 6/1980 | Janning |
| 4,245,182 A | | 1/1981 | Aotsu |
| 4,321,643 A | | 3/1982 | Vernier |
| 4,371,832 A | | 2/1983 | Wilson |
| 4,511,811 A | | 4/1985 | Gupta |
| 4,542,468 A | | 9/1985 | Taniguti |
| 4,556,946 A | | 12/1985 | Taniguti |
| 4,558,309 A | | 12/1985 | Antonevich |
| 4,667,263 A | | 5/1987 | Morris |
| 4,763,057 A | | 8/1988 | Danz |
| 4,820,991 A | | 4/1989 | Clark |
| 4,825,327 A | | 4/1989 | Alexander |
| 4,851,758 A | | 7/1989 | Ostada |
| 4,939,506 A | | 7/1990 | Gram |
| 4,982,147 A | * | 1/1991 | Lauw .................... H02P 25/024 318/721 |
| 5,057,962 A | | 10/1991 | Alley |
| 5,252,915 A | * | 10/1993 | Sedding ............... G01R 31/343 324/545 |
| 5,264,778 A | | 11/1993 | Kimmel |
| 5,363,047 A | | 11/1994 | Dresti |
| 5,508,620 A | | 4/1996 | Pfiffner |
| 5,514,963 A | | 5/1996 | Korbmacher |
| 5,519,300 A | | 5/1996 | Leon |
| 5,581,470 A | | 12/1996 | Pawloski |
| 5,592,393 A | | 1/1997 | Yalla |
| 5,633,550 A | | 5/1997 | Meehan |
| 5,675,465 A | | 10/1997 | Tanaka |
| 5,739,693 A | | 4/1998 | Pfiffner |
| 5,764,462 A | | 6/1998 | Tanaka |
| 5,805,395 A | | 9/1998 | Hu |
| 5,933,306 A | | 8/1999 | Santos |
| 5,982,595 A | | 11/1999 | Pozzuoli |
| 6,121,886 A | | 9/2000 | Anderson |
| 6,137,187 A | | 10/2000 | Mikhail |
| 6,169,489 B1 | | 1/2001 | Kliman |
| 6,262,550 B1 | | 7/2001 | Kliman |
| 6,294,898 B2 | | 9/2001 | Lawson |
| 6,396,284 B1 | | 5/2002 | Tisdale |
| 6,426,632 B1 | | 7/2002 | Clunn |
| 6,459,269 B1 | | 10/2002 | Jones |
| 6,492,801 B1 | | 12/2002 | Sims |
| 6,525,504 B1 | | 2/2003 | Nygren |
| 6,714,020 B2 | | 3/2004 | Hobelsberger |
| 6,794,879 B2 | | 9/2004 | Lawson |
| 6,794,883 B2 | | 9/2004 | Klingel |
| 6,815,932 B2 | | 11/2004 | Wall |
| 6,839,207 B2 | | 1/2005 | Falliot |
| 6,924,565 B2 | | 8/2005 | Wilkins |
| 6,924,628 B2 | | 8/2005 | Thompson |
| 6,975,946 B2 | | 12/2005 | Al-Hamrani |
| 6,992,490 B2 | | 1/2006 | Nomoto |
| 7,006,935 B2 | | 2/2006 | Seki |
| 7,253,634 B1 | | 8/2007 | Kasztenny |
| 7,304,403 B2 | | 12/2007 | Xu |
| 7,498,818 B2 | | 3/2009 | Benmouyal |
| 7,528,611 B2 | | 5/2009 | Kasztenny |
| 7,532,010 B2 | | 5/2009 | Kamel |
| 7,592,772 B2 | | 9/2009 | Nandi |
| 7,710,693 B2 | | 5/2010 | Guzman-Casillas |
| 7,804,303 B2 | | 9/2010 | Benmouyal |
| 8,405,940 B2 | | 3/2013 | Schweitzer, III |
| 2001/0001534 A1 | | 5/2001 | Lawson |
| 2002/0128759 A1 | | 9/2002 | Sodoski |
| 2002/0140433 A1 | | 10/2002 | Lawson |
| 2005/0033481 A1 | | 2/2005 | Budhraja |
| 2006/0125486 A1 | | 6/2006 | Premerlani |
| 2007/0085549 A1 | * | 4/2007 | Fischer ................. G01R 29/16 324/521 |
| 2008/0074810 A1 | * | 3/2008 | Guzman-Casillas ....... H02H 7/065 361/20 |
| 2009/0039655 A1 | * | 2/2009 | Berchowitz ............ F02G 1/043 290/1 A |
| 2009/0160454 A1 | | 6/2009 | Johansson |
| 2009/0219030 A1 | | 9/2009 | Salem |
| 2009/0254297 A1 | | 10/2009 | Bengtsson |
| 2010/0194324 A1 | * | 8/2010 | Kasztenny ............ G01R 31/34 318/490 |
| 2012/0112758 A1 | | 5/2012 | Weems |

FOREIGN PATENT DOCUMENTS

| | | |
|---|---|---|
| JP | 54077549 | 1/1981 |
| JP | 2003777 | 9/1991 |
| JP | 5318853 | 7/1995 |
| JP | 9309737 | 5/1999 |
| JP | 11140927 | 11/2000 |
| WO | WO0239642 | 5/2002 |
| WO | WO2014067742 | 5/2014 |
| WO | WO 2014067742 A1 * | 5/2014 ........... G01R 31/343 |

OTHER PUBLICATIONS

PCT/US2015/041950 Patent Cooperation Treaty, International Search Report and Written Opinion of the International Searching Authority, dated Oct. 16, 2015.

Rik Pintelon, Johan Schoukens, System Identification: A Frequency Domain, Section 4.3 (pp. 119-131), Jan. 1, 2001.

Beckwith Electric Co., M-3425A, Generator Protection, Published: 2001.

Siemens AG, Numerical Machine Protection Manual, Published 1996.

Type DGF Generator Field Relay, ABB Automation, Inc. Feb. 1977.

J.Lewis Blackburn, Protective Relaying Principles and Applications, Chapter 8: Generator Protection, pp. 262-267, 1997.

TYCO Electronics Energy Division, Installation and Operating Instructions R.O.C.O.F. Protection Relay, Nov. 2002.

PCT/US2010/052452, Patent Cooperation Treaty, International Search Report and Written Opinion of the International Searching Authority, dated Dec. 9, 2010.

* cited by examiner

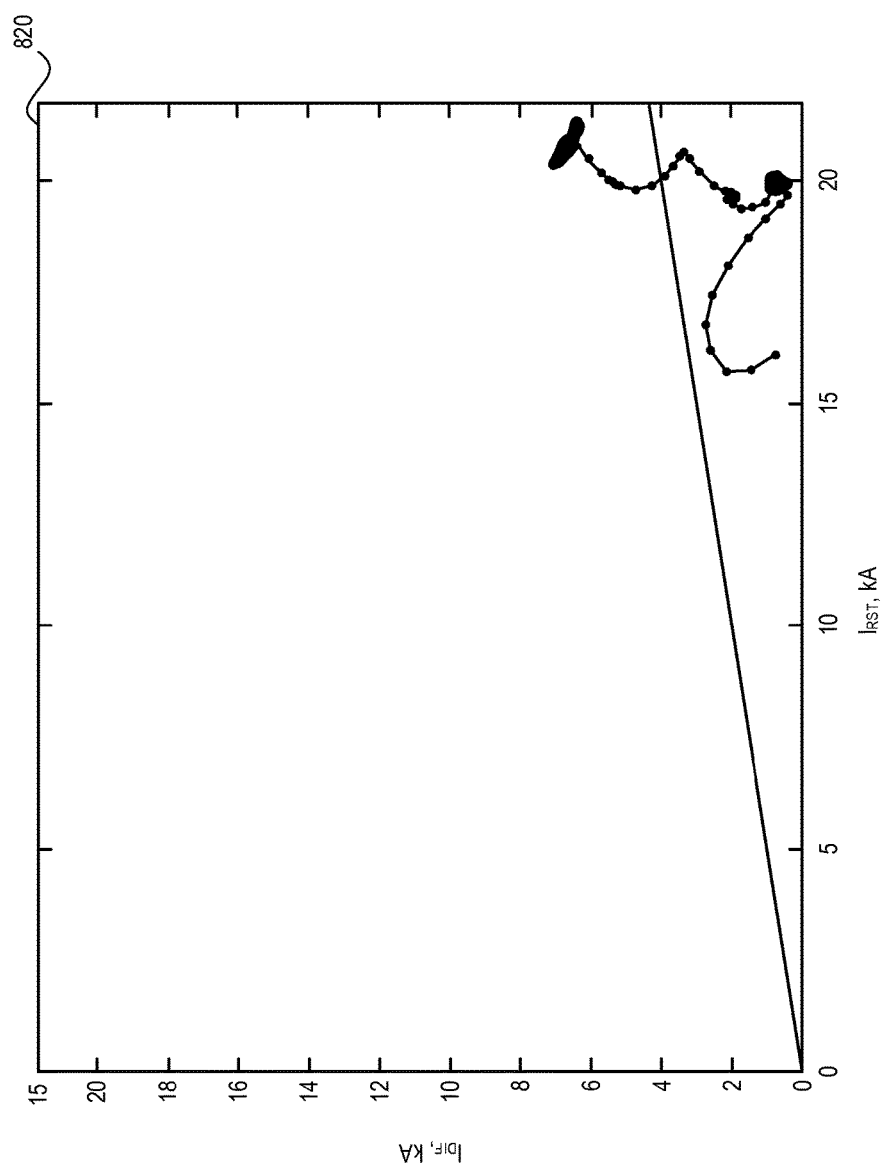

SYSTEMS AND METHODS FOR MONITORING AND PROTECTING AN ELECTRIC POWER GENERATOR

RELATED APPLICATIONS

The present application claims the benefit under 35 U.S.C. § 119(e) of U.S. Provisional Patent Application No. 62/028,689 filed Jul. 24, 2014, titled "Stator-Rotor Differential Protection," which application is incorporated herein by reference in its entirety, to the extent such subject matter is not inconsistent herewith.

TECHNICAL FIELD

This disclosure relates to systems and methods for monitoring and/or protecting electric power generators. More particularly, this disclosure relates to the detection of one or more faults of an electric power generator.

BRIEF DESCRIPTION OF THE DRAWINGS

Non-limiting and non-exhaustive embodiments of the disclosure are described herein, including various embodiments of the disclosure with reference to the figures listed below.

FIG. 8B is a graph of an 87SF differential element during an external A-phase to B-phase fault that is followed by an A-phase turn fault, according to the embodiment of FIG. 8A.

DETAILED DESCRIPTION

Figure 1A:
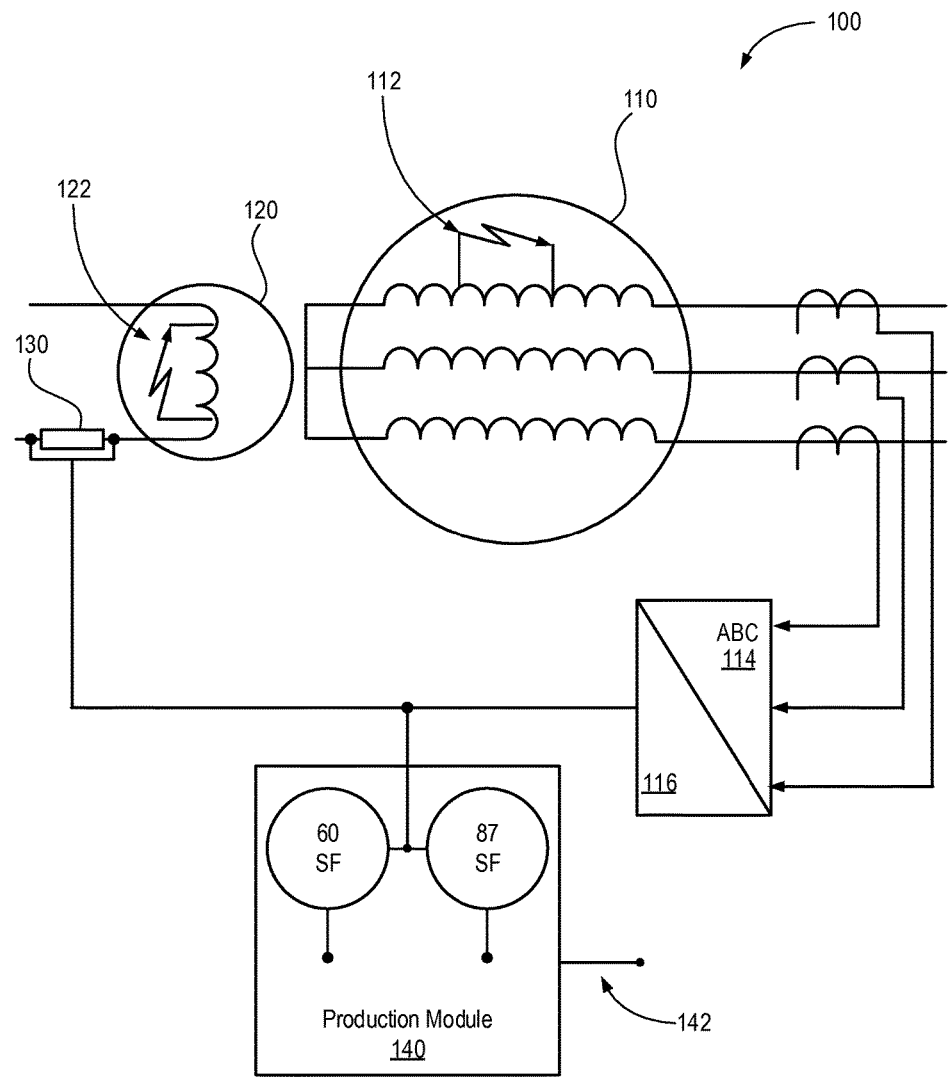
FIG. 1A is a system for detecting one or more faults of a protected generator, according to one embodiment.

This disclosure provides various embodiments of generator protection systems that provide protection for phase-ground faults and/or phase-phase faults. A turn fault of an electric power generator may include faults between coils of a single phase of a stator (i.e. stator turn faults) and/or may include faults between coils of a field or rotor winding (i.e. rotor turn faults). In some instances, stator turn faults and/or rotor turn faults do not include a ground connection or connection between phases. As a result, turn faults are not detectable by many existing fault detecting elements, such as a stator phase-phase element, a stator phase-ground element, or a rotor-ground fault element. Thus, currently existing stator differential elements are incapable of detecting one or more turn faults of an electric power generator. Similarly, an internal high-impedance series connection or open-circuit does not create a current flow to ground or between phases and is not detectable by many existing fault detecting elements.

Some generators, such as hydro-generators, may have stator windings that are constructed from as many as eight parallel branches per phase. Under normal (e.g., unfaulted) operation the current in each parallel branch is virtually identical. The generator may be constructed such that these branches are grouped and the groups are externally accessible, allowing the currents flowing in two or more groups to be compared using so-called split-phase current transformers (CTs). This scheme, known as split phase protection, detects a turn fault as a difference in current following in the parallel branches.

If the parallel branches are not accessible (typical of turbo-generators), then split phase protection cannot be applied. As an alternative, the zero sequence voltage measured at the machine terminals can be used to detect turn faults. Since large synchronous generators are typically grounded through high impedance, measurement of the generator zero sequence voltage requires a special power transformer (PT) connection, where the PT neutral is connected between the generator neutral and the neutral grounding resistor. The cable connecting these neutrals may require a rating corresponding to the phase-neutral voltage of the machine. This cable may be expensive, difficult to install, and subject to failure.

Windings constructed from form-wound, multi-turn coils have considerable exposure increasing the probability of turn faults. Additionally, the field winding will be constructed from multi-turn coils and thus field turn faults are also possible. Although the possibility of a field turn fault may be as likely as a field ground fault, because of the detection challenges, typically only ground fault protection is applied. It is possible to detect a field turn fault by signature analysis of the waveform captured from an air-gap flux probe but this is a manual test and is not carried out automatically by a protective relay. Travelling-wave analysis and harmonic analysis of the field current have also been proposed to detect field turn faults.

These methods do not have a simple operating principle as compared with traditional protection techniques such as the differential, directional or distance. Instead they are evidence-based and heuristic, potentially making them more difficult to successfully apply. This disclosure provides various embodiments of methods and systems for detecting one or more turn faults of an electric power generator. In some embodiments, the systems and methods disclosed herein utilize voltage and/or current measurement systems commonly included in existing embodiments of an electric power generator or generator relay monitoring and/or protection equipment. In various embodiments, the term generator is used to describe any of a wide variety of electromechanical motion devices, including synchronous electromechanical devices such as electric motors, power generators, and electromagnets.

According to various embodiments, a system may include a first input, a second input, and a protection module. The first input of the system may be configured to receive a rotor electrical characteristic (e.g., voltage, current, phase angle, flux, etc.) from a rotor of the protected generator. For example, in some embodiments the rotor electrical characteristic may include a field current associated with the field windings of the rotor. In many instances within this disclosure a rotor electrical characteristic may be referred to herein as a field electrical characteristic with reference to the same, or substantially the same, electrical characteristic such that the terms "field" and "rotor" may be used interchangeably.

The second input of the system may be configured to receive at least one stator electrical characteristic of at least one stator phase of the electric power generator. For instance, the stator electrical characteristic may include at least one current and/or voltage of at least one stator phase. In some embodiments, the stator electrical characteristic may include or be used to derive a terminal-side current, a neutral-side current, a negative sequence current, and/or a positive sequence voltage.

Under unbalanced conditions, the relationships between various rotor and stator quantities may be governed by a phase-domain or two-axis model of a synchronous machine or the like. One relationship may be embodied in an ampere-turn balance between a pair of rotor-stator quantities. Other embodiments are possible.

The protection module may determine an ampere-turn balance between a rotor and a stator of the protected generator, and may detect any current unbalances of the stator or rotor of the protected generator. In various embodiments, the protection module may functionally characterize the protected generator as a transformer having an effective transformation ratio corresponding to a stator field ratio value.

As an example, the protection module may be configured to determine a rotor electrical value based on the rotor electrical characteristic received via the first input. The determined rotor electrical value may include a rotor phasor with a frequency that is approximately equal to twice an operating frequency of the generator (e.g. 120 Hz or 100 Hz). The rotor phasor may be based on a field current of the rotor electrical characteristic.

The frequency of the rotor phasor or a frequency of the rotor electrical value may correspond to the frequency of the field current, such that the two frequencies may be approximately equal to one another. Thus, in some embodiments, the field current associated with field windings of the rotor may include a frequency approximately equal to twice the operating frequency of the protected generator (e.g., 120 Hz or 100 Hz). In some embodiments, the protection module may match a frequency of the determined rotor electrical value and a frequency of the determined stator electrical value by multiplying at least one of the determined rotor electrical value and the determined stator electrical value by a rotating vector with a rotating frequency.

The protection module may determine one or more stator electrical values based on at least one stator electrical characteristic received via the second input. The stator electrical characteristic and corresponding stator electrical value may be associated with each of the stator phases of the protected generator. Each stator electrical value may correspond to a specific electrical characteristic of a specific stator phase.

In various embodiments, a stator electrical value may be determined for a specific phase(s) and/or for a specific terminal(s) of a stator, and may include more than one stator phase current. The stator electrical value may include one or more currents or current components (e.g., real and/or imaginary components) of the stator phase or terminals. The stator electrical value may instead or additionally include a frequency component of a stator phase current coupled with a magnetic field.

A stator phase current or current component, of a stator electrical value may be coupled with a rotating magnetic field. The magnetic field may rotate opposite to the rotation of the rotor of the protected generator. The rotating magnetic field may be associated with a negative-sequence current of the stator.

A stator electrical value may include a stator phasor with a frequency that corresponds to (e.g., equal or a ratio of) the operating frequency of the protected generator. Examples of stator electrical values and/or associated characteristics include terminal current, a neutral side current, a negative-sequence current, and/or, a positive-sequence voltage, or any other suitable current and/or voltage associated with the stator, or a stator phase, of the protected generator.

The protection module may determine a stator-rotor differential value based on a difference of the determined rotor electrical value and the determined stator electrical value. The stator-rotor differential value may be based on a difference of the real and/or imaginary portions of the rotor electrical value and the stator electrical value. Additionally or alternatively, the stator-rotor differential value may be based on another suitable comparison of one or more portions of the two electrical values, such as a vector difference including magnitude and phase.

In some embodiments, the protection module may normalize the rotor electrical value and the stator electrical value by multiplying one of the values by a constant associated with a turn ratio of the protected generator. For example in some embodiments, the ratio of the stator electrical value and the rotor electrical value may approximate an effective transformation ratio or a stator field ratio value of a protected generator.

The protection module may determine a turn fault value associated with the protected electric power generator. Some embodiments of the protection module may determine a turn fault value based on the stator-rotor differential value associated with the protected generator. For example, the system may identify changes in the effective transformation ratio of the protected generator indicative of an internal fault condition of the protected generator.

As previously described, an internal fault of the protected generator may include a turn fault of a rotor, such as one or more turn faults, of the rotor windings. Alternatively or additionally, an internal fault may include a turn fault of the stator, such as a turn fault of stator windings, or a stator phase fault.

Some embodiments of the system may include an unbalance magnitude element between the stator and the field of the protected generator (e.g., a SEL 60SF unbalance device) configured to operate according to a difference between two or more currents of a plurality of currents of the protected generator. Throughout this disclosure, references to a 60SF are by way of example only. Any of a wide variety of magnitude differential elements and/or devices may be substituted for the 60SF device.

Some embodiments of the system may include a magnitude and angle differential element between the stator and field of the protected generator (e.g., a SEL 87SF differential device), configured to operate according to a difference of two or more currents and a rotor position of the protected generator. The rotor angular position associated with the protected generator may include a frequency (e.g., a rotational frequency) of the rotor, a power angle, and an impedance parameter of the protected generator ($X_d$). Other embodiments of the system may include an 87SF element or functionally similar or equivalent device configured to utilize direct measurement of the instantaneous rotor position of the protected generator. Throughout this disclosure, references to an 87SF are by way of example only. Any of a wide variety of magnitude and angle differential elements and/or devices may be substituted for the 87SF device.

The protection module may operate by determining if a stator-rotor unbalance or differential value exceeds a threshold fault value (where the threshold can be defined by time, magnitude, phase angle, etc.) and may report a turn fault value associated with the protected generator to a fault monitoring system or other suitable system. The fault monitoring system may take appropriate action and/or notify other systems and/or entities. For example, the protection module may report a turn fault value to a fault monitoring system configured to operate one or more breakers, current transformers, switches, generator relays, and/or additional fault protection subsystems in response to a turn fault value reported by the protection module.

Some embodiments of the protection module may match the frequency of the rotor electrical value and the frequency of the stator electrical value by multiplying the rotor electrical value by a first rotating vector having a first rotating frequency, and the stator electrical value by a second rotating vector having a second rotating frequency. The resulting products may correspond to a rotor electric value and a stator electric value with frequencies that correspond to one another.

A frequency difference of the first rotating frequency and the second rotating frequency may correspond to the operating frequency of the generator. For example, the first rotating frequency may be approximately equal to the operating frequency of the generator, and the second rotating frequency may be approximately equal to two times the operating frequency of the generator.

The system may include a first filter configured to extract one of the rotating vectors of the first and second rotating vectors. The first filter may be tuned to determine a rotating vector with a frequency approximately equal to the frequency of operation of the generator (e.g., 60 Hz or 50 Hz). In some embodiments, the first and second filter may be a full cycle cosine filter. The system may include a second filter configured to extract one of the first and second rotating vectors. The second filter may be tuned to a frequency that is approximately twice the operating frequency of the generator.

A phase difference of the first and second filtered quantities may be an approximately constant value, and may represent a relatively small angle. The phase difference of the two filtered quantities may be based on the configuration or construction of the two filters. In an embodiment wherein both the first filter and the second filter are implemented as full fundamental cycle cosine filters, the phase difference between the two filtered quantities may be approximately equal to five degrees. The protection module may match the phase angles of the rotor and stator electrical values by adjusting the phase angle of at least one of the values by a phase angle adjustment.

Thus, a system may normalize various values determined from measured electrical characteristics of the rotor and stator. The protection module may determine the stator-rotor differential value based on any comparison of such values (e.g., the normalized, frequency matched values, and/or normalized, phase angle-matched electrical values). The protection module may base the stator-rotor differential element on a difference of magnitudes, a difference of real portions, a difference of complex or imaginary portions, and/or, an absolute value of, or geometric difference of, any such differences, of two or more phasors of the normalized electrical values, the frequency-matched electrical values, and/or the phase angle-matched electrical values.

In some embodiments, the system may determine if an unbalance is associated with the protected generator by calculating and evaluating a negative-sequence differential value. Further, some embodiments may determine if an electrical unbalance is associated with the protected generator by calculating and evaluating a stator-rotor current unbalance or corresponding current unbalance value.

In such embodiments, calculating the stator-rotor current unbalance may include determining an operating electrical value or operating signal and a restraining electrical value or restraining signal, and comparing the operating and restraining signals to determine if an external electrical unbalance is associated with the protected generator. The determined operating signal may be calculated (e.g., by the protection module) based on a negative-sequence current, of at least one stator electrical characteristic, and a field current of the rotor electrical characteristic.

Specifically, the operating electrical value, $I_{OP}$, may be calculated with regard to the 60SF element and may be determined according to Equation 1.

$$I_{OP\_60SF} = ||I_{2(Nom)}| - N_{SF} \cdot I_{F(2 \times Nom)}|| \qquad \text{Equation 1}$$

Where: $I_2$ corresponds to the negative-sequence current of at least one stator electrical characteristic; $N_{SF}$ corresponds to a predetermined stator field ratio value, which value may be associated with a plurality of electrical values of the protected generator; $I_F$ corresponds to the field current (or at least a field current component) with an electrical frequency approximately equal to twice the operating frequency of the generator.

The stator field unbalance may be determined according to a stator field operational electrical component and a stator field restraining electrical component. Specifically, the protection element may compare the stator field operate electrical component and the stator field restraining electrical component. The stator field restraining value may be calculated or determined based on a negative-sequence current of the stator electrical characteristic, and a field current of the rotor electrical characteristic.

As mentioned previously, the system may calculate the restraining electrical value based on a negative-sequence current, of the at least one stator electrical characteristic, and a field current of the rotor electrical characteristic. More specifically, the restraining signal, $I_{RST}$, may be determined or calculated with regard to the 60SF element according to Equation 2, where $S_{60SF}$ is a percentage setting and $I_{MIN60SF}$ is a minimum level setting.

$$I_{RST\_60SF} = S_{60SF} \cdot ||I_{2(Nom)}| + N_{SF} \cdot I_{F(2 \times Nom)}|| + I_{MIN60SF} \qquad \text{Equation 2}$$

The system may calculate the operating signal, $I_{OP}$, with regard to the 87SF element. Accordingly, the operating signal may be based on a stator field differential electrical component, or a difference of stator and field electrical components. More specifically, the operating signal may be determined according to Equation 3.

$$I_{OP\_87SF} = |I_2 + N_{SF} \cdot I_F \cdot 1 \angle -\Theta_C| \qquad \text{Equation 3}$$

Where $I_2$ corresponds to the negative-sequence current based on at least one stator electrical characteristic. A frequency of the negative-sequence current may be adjusted to correspond to a base frequency of the system, and/or, one or more frequency matched electrical values of the system. $N_{SF}$ corresponds to a predetermined stator field ratio value. $I_F$ corresponds to the field current, or corresponding electrical value, with an adjusted frequency that corresponds to the base frequency of the system or a frequency matched electrical values. $\Theta_C$ corresponds to a shift in the field current.

Moreover, the restraining signal, $I_{RST}$, may be determined with regard to the 87SF element according to Equation 4, where $S_{87SF}$ is a percentage setting and $I_{MIN87SF}$ is a minimum level setting.

$$I_{RST\_87SF} = S_{87SF} \cdot |I_{2(Nom)} - N_{SF} \cdot I_{F(Nom)} \cdot 1 \angle -\Theta_C| + I_{MIN87SF} \qquad \text{Equation 4}$$

The 60SF/87SF element may operate when the operating signal is greater than the restraining signal. Further, the system may determine a stator field ratio value, or effective transformation value, based on a ratio of negative-sequence stator current and a field current of the protected generator during normal operation. The stator field ratio value may be based on the magnitude of the negative-sequence stator current divided by the magnitude of the field current. In other embodiments, the stator field ratio value is based on an equivalent or approximately equivalent ratio. In still other embodiments, the stator field differential electrical component is based on a negative-sequence current, of the at least one stator electrical characteristic and on a field current of at least one rotor electrical characteristic.

In various embodiments, the stator field ratio value may not represent, or correspond to, a true ratio of turns physically present in the stator and/or the rotor of the protected generator. The rotor turn fault value may be based on the determined stator field differential value. In various embodiments, the system may also or alternatively determine a stator phase fault value. A stator differential value may be based on the at least one stator electrical characteristic, and may be based on the location of a stator phase fault. As described herein, fault values (e.g., a rotor turn fault value, a stator turn fault value, etc.) may be numerically assigned values corresponding to measured or reported data.

For example, the protection module may compare the positive-sequence voltage and the negative-sequence current to determine a phase location of the stator phase fault. In some embodiments, the protection module may compare the positive-sequence voltage and negative-sequence current by calculating a phase angle difference between the positive-sequence voltage and the negative-sequence current, or may calculate a phase angle difference between two phasors representing the positive-sequence voltage and the negative-sequence current.

The protection module may determine that a stator phase fault is on a specific stator phase (e.g. A-phase, B-phase, or C-phase). For example, the protection module may determine a stator phase fault is on an A-phase when the determined phase angle difference is between 0 degrees and +120 degrees. The protection module may determine that the stator phase fault is on a C-phase when a phase angle difference is between +120 degrees and −120 degrees. The protection module may determine that the stator phase fault is on a B-phase when a phase angle difference is between −120 degrees and 0 degrees.

In some embodiments, the system may determine a stator turn fault value and/or in what stator phase the stator turn fault is located. The protection module may also determine an external unbalance condition indicative of no external unbalances of the electric power generator, based on the at least one stator electrical characteristic. The system may determine a stator differential value based on the at least one stator electrical characteristic. The stator differential value may be used to determine if a stator phase fault is present in the electric power generator and/or a location of the stator turn fault.

As previously described, according to various embodiments, one or more modules (implemented in hardware, software, and/or firmware) may be configured to receive a rotor electrical characteristic from a rotor of the protected generator via a first input. At least one stator electrical characteristic of at least one stator phase of the electric power generator may be received via a second input.

The protection module may determine a rotor electrical value based on the rotor electrical characteristic and a stator electrical value based on the received stator electrical characteristic. The determined rotor electrical value may include a rotor phasor with a frequency that corresponds to an operating frequency of the generator (e.g. 120 Hz). The rotor phasor may alternatively or additionally be based on a field current of the rotor electrical characteristic.

The stator electrical value may include a stator phasor with a frequency that corresponds to the operating frequency of the protected generator. One or more determined stator electrical values may be based on a stator electrical characteristic, such as a terminal-side current, a neutral-side current, a negative-sequence current, and/or a positive-sequence voltage, or any other suitable current and/or voltage associated with the stator, or a stator phase, of the protected generator.

The protection module may determine a stator-rotor differential value based on a difference of the rotor electrical value and the stator electrical value. The protection module may determine a turn fault value associated with the electric power generator and/or a turn fault value based on the stator-rotor differential value.

In some embodiments, the rotor electrical value and the stator electrical value may be normalized by multiplying one of the rotor electrical value and the stator electrical value by a constant associated with a turn ratio.

Calculating the stator-rotor current unbalance may include determining an operating electrical value, determining a restraining electrical value, and comparing the operating and restraining electrical values. The protection module may be configured to calculate the operating electrical value based on a negative-sequence current of the one or more stator electrical characteristic and a field current of the rotor electrical characteristic.

The embodiments of the disclosure can be understood by reference to the drawings, wherein like parts are designated by like numerals throughout. Components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as modules or components that can be embodied as software, hardware, and/or firmware. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc. that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

Figure 1B:
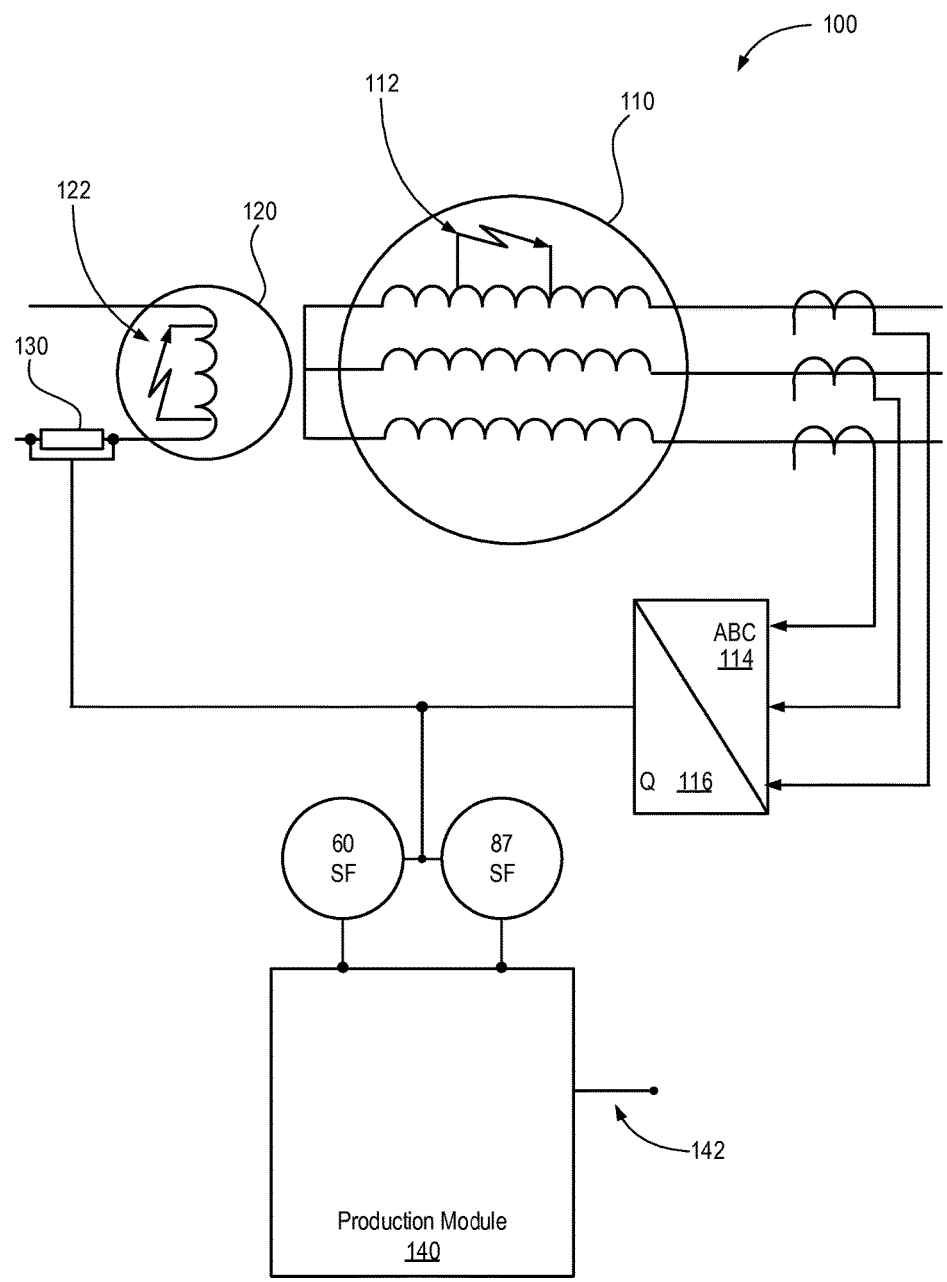
FIG. 1B is another embodiment of a system for detecting one or more faults of a protected generator.

FIG. 1A illustrates a generator fault protection system 100, according to one embodiment. The system includes a stator 110, a stator electrical characteristic 112, a plurality of stator terminals (A-terminal, B-terminal, and C-terminal) 114, a stator logic module 116, a rotor 120, a rotor electrical characteristic 122, a field current shunt 130, a protection module 140 with a rotor differential component (60 SF), a stator differential component (87 SF), and a protection module output 142. FIG. 1B is similar to FIG. 1A, but illustrates the difference component 60 SF and the stator differential component 87 SF external to a protection module 141, according to one alternative embodiment.

Figure 2A:
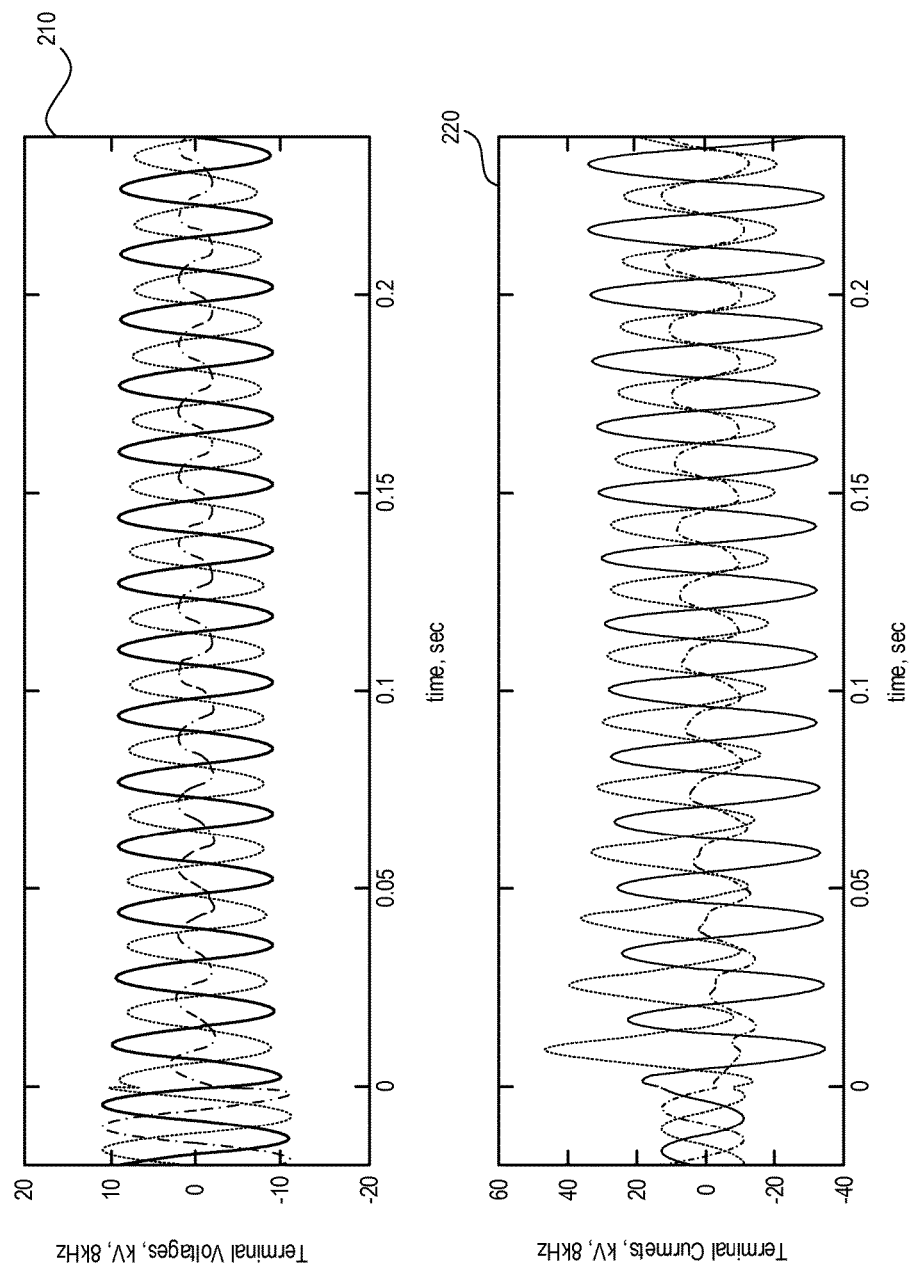
FIG. 2A is a graph of several terminal voltages and currents during an external A-phase to B-phase fault, according to one embodiment.

FIG. 2A includes a graph 210 of the magnitude of several voltages on the y-axis and time one the x-axis and a graph 220 with the magnitude of several currents on the y-axis and time on the x-axis. Both graphs 210 and 220 show electrical characteristics of a protected generator, according to one embodiment. The voltages and currents may be measured at the terminals of the protected generator during an external electrical unbalance, or an external A-phase to B-phase fault associated with the protected generator. The external electrical unbalance associated with the protected generator begins at time 0 of the x-axis of both graphs 210 and 220 of FIG. 2A. In some embodiments, one or more of the voltages and/or currents of FIG. 2A may be indicative of at least one fault condition of the protected generator or system.

Figure 2B:
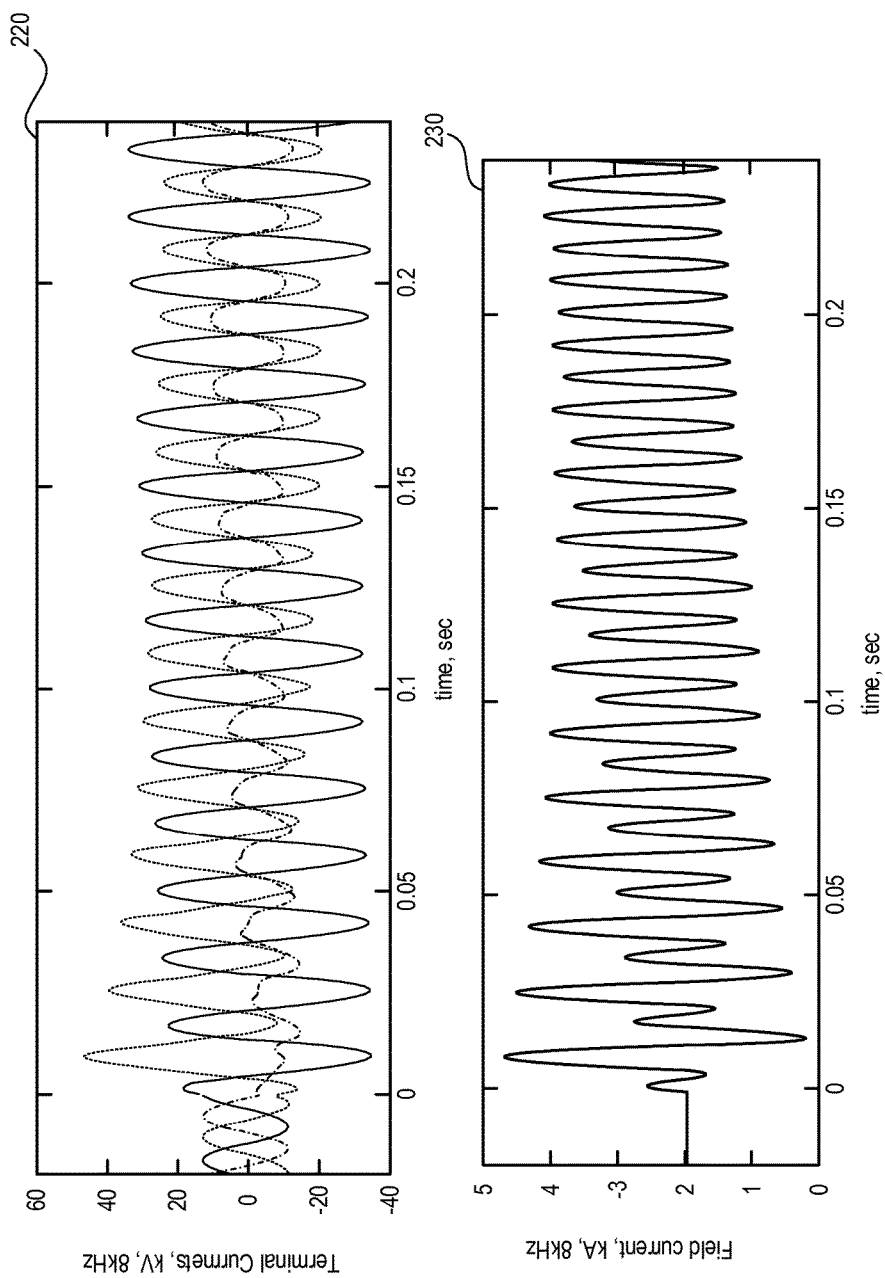
FIG. 2B is a graph of terminal currents and a field current during an external A-phase to B-phase fault, according to the embodiment of FIG. 2A.
Figure 2C:
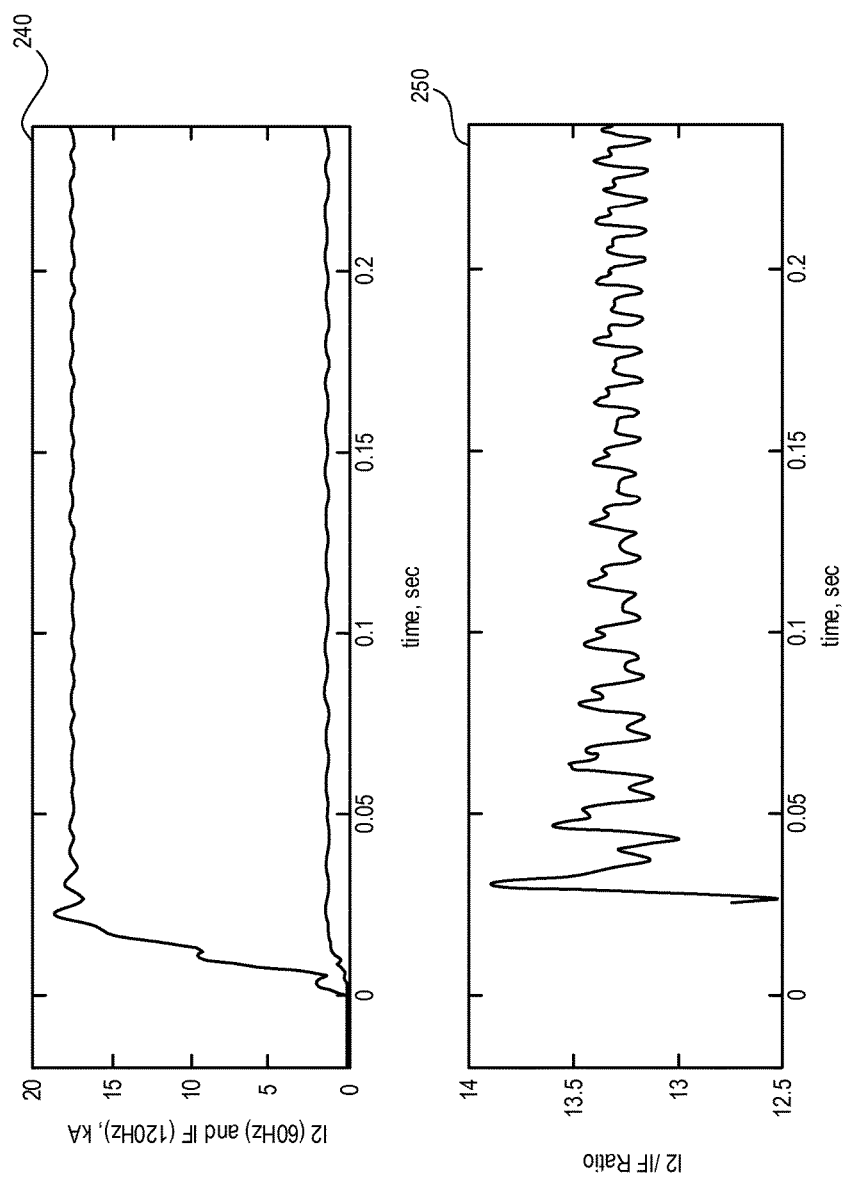
FIG. 2C is a graph of the magnitude of a negative-sequence current, the magnitude of a double-frequency field current, and a ratio based on the two currents, during an external A-phase to B-phase fault, according to the embodiment of FIG. 2A.

FIG. 2B includes a graph 220 of several terminal currents and a graph 230 of a field current with an external electrical unbalance, or external A-phase to B-phase fault associated with the protected generator beginning at time 0, according to the embodiment of FIG. 2A. One or more of the terminal currents and/or the field currents of FIG. 2B is indicative of at least one fault condition of a protected generator or protected system. FIG. 2C includes a graph 240 of the magnitudes of a negative-sequence current and a field current and a graph 250 of the magnitude of a ratio of the two currents, according to the embodiment of FIG. 2A.

Figure 3:
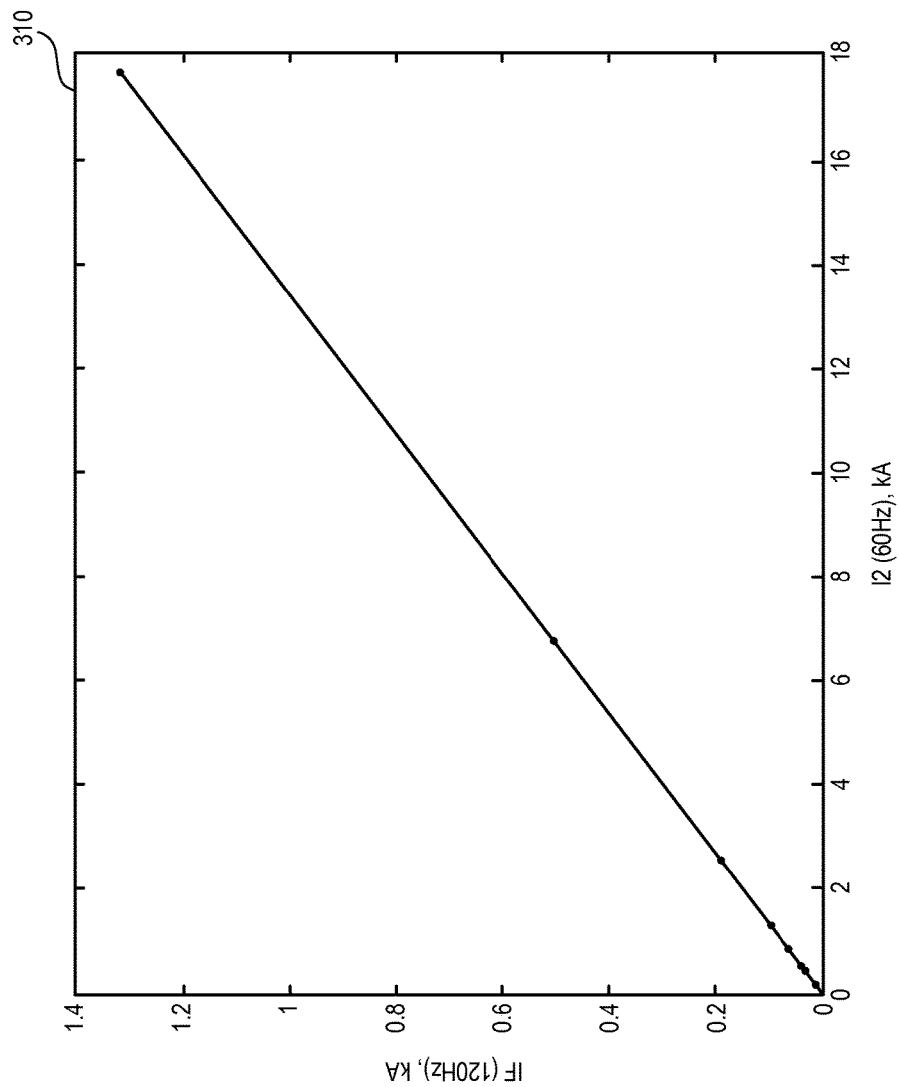
FIG. 3 is a graph of a relationship between the magnitude of the negative-sequence current and the magnitude of the double-frequency field current, according to one embodiment.

FIG. 3 is a graph 310 of a ratio of the magnitudes of the negative-sequence current and the field current, according to one embodiment. The ratio of the two currents may be represented by the constant slope of the line shown in the graph 310.

FIGS. 2A-2C and FIG. 3 may illustrate several simulations of the system described herein, according to a model of a 200 MW, 13.8 kV machine. The simulations were determined according to an array of conditions of the protected generator. For example, the simulations include 16 external faults between different stator phases (A-phase to ground, Between A-phase and B-phase), with different power flow (50 MW, 200 MW), and with different fault resistance values (0 ohms, 5 ohms, 10 ohms, and 25 ohms).

FIGS. 2A-3 illustrate various electrical characteristics of the protected generator associated with an external electrical unbalance, including a ratio of the negative-sequence current and the double-frequency current component of the field current. As illustrated, the ratio based on the negative-sequence current and the double-frequency currents may be a constant, or approximately equal to a constant value, during external electrical unbalances. Further, the ratio value may remain constant during operation of the protected generator even as the magnitude of the negative-sequence current changes.

Each simulation corresponding to an individual fault, or fault condition, includes a different negative-sequence current from other simulations corresponding to other fault conditions. The results of the simulated embodiments illustrates the relationships of the ratios $I_2$ (60 Hz) and $I_F$ (120 Hz) with the various fault conditions. A steady state value may be associated with each simulated result shown in the figures. A steady state value may be an accurate average of the simulation value after two or more periods of the system frequency have elapsed. Further, allowing the protection system to operate according to an average of the electrical characteristics of the protected generator may reduce superfluous results and may improve the accuracy of system operation.

Figure 4A:
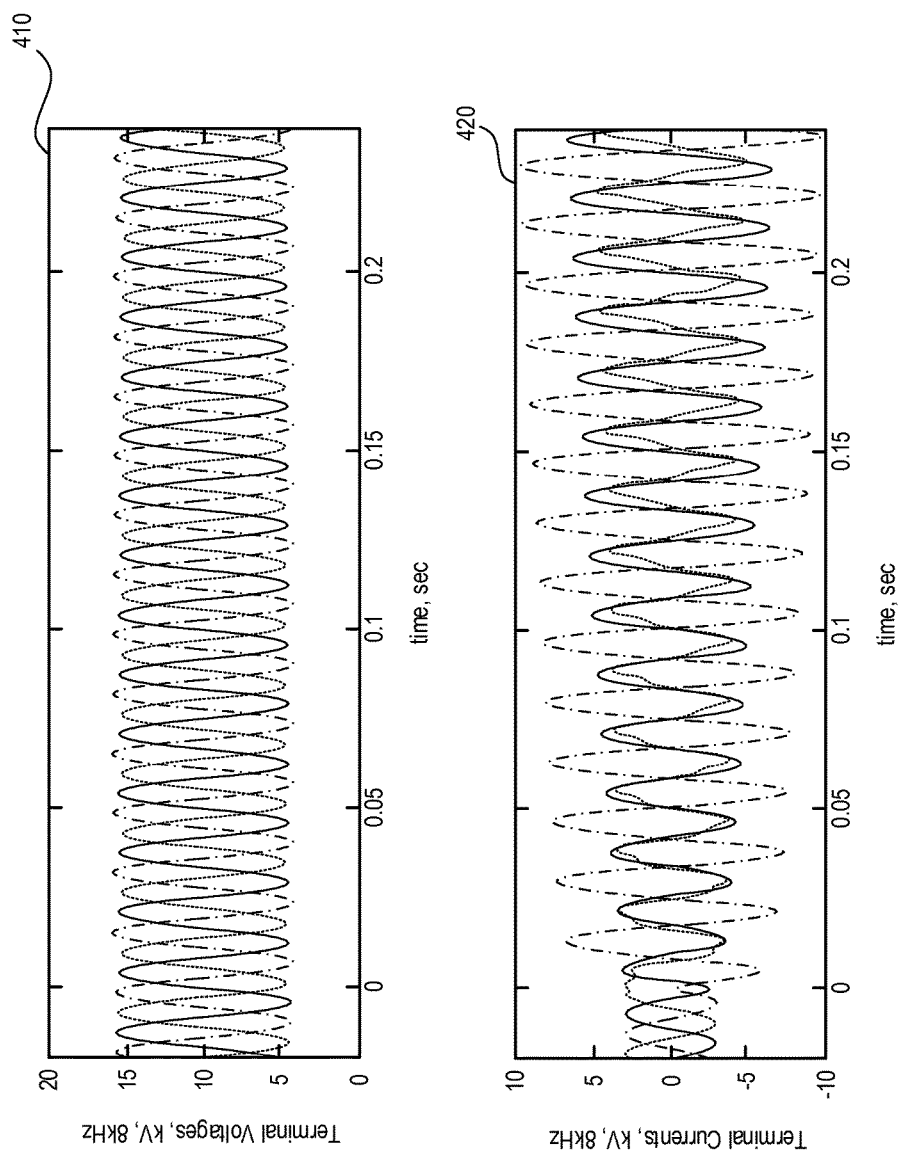
FIG. 4A is a graph of several terminal voltages and currents during a turn fault, according to one embodiment.

FIG. 4A includes a graph 410 of several terminal voltages and a graph 420 of several terminal currents during at least external phase to phase fault (e.g., one or more stator or rotor turn faults) of the protected generator beginning at time 0. One or more of the terminal voltages and/or terminal currents of FIG. 4A is indicative of at least one fault condition (e.g. an internal fault or a turn fault) of a protected generator (or other system).

Figure 4B:
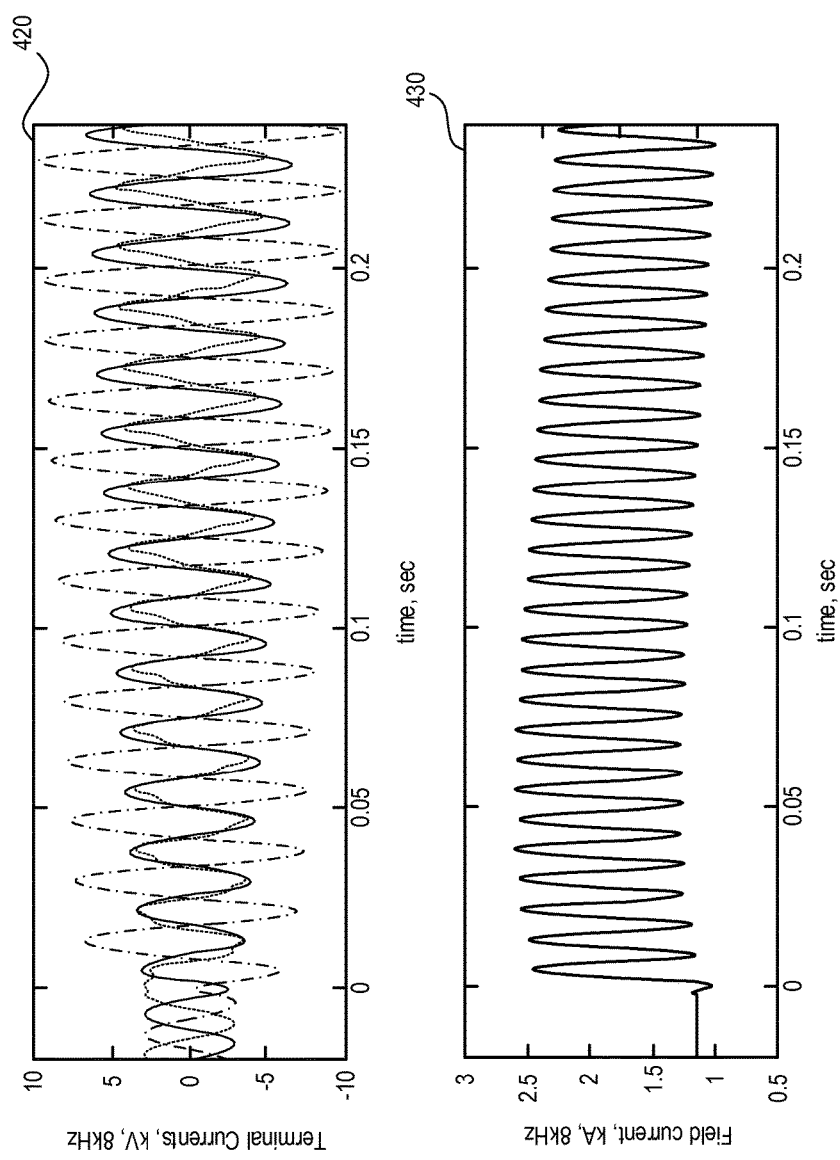
FIG. 4B is a graph of several terminal currents and a field current during a turn fault, according to the embodiment of FIG. 4A.
Figure 4C:
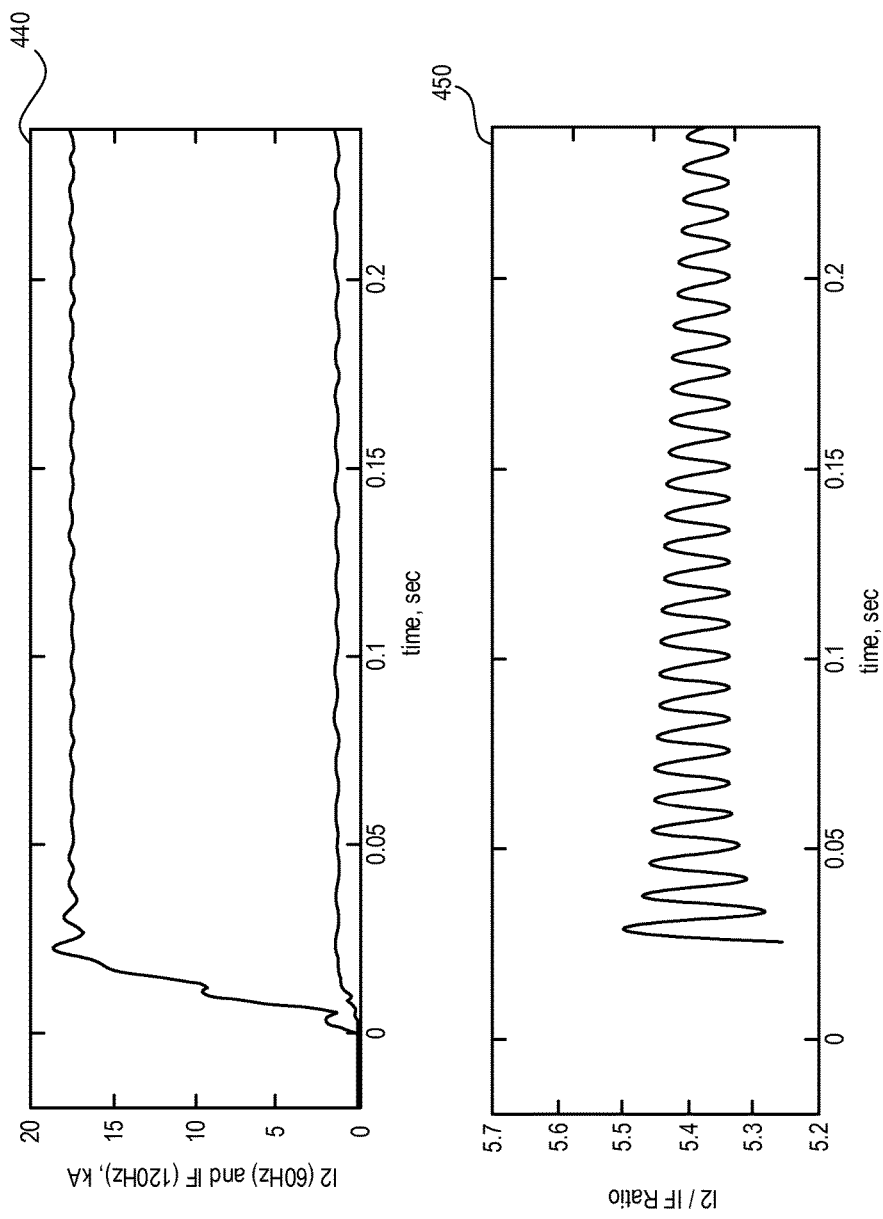
FIG. 4C is a graph of the magnitude of a negative-sequence current, the magnitude of a double-frequency field current, and a ratio of the two currents, during a turn fault, according to the embodiment of FIG. 4A.

FIG. 4B includes a graph 420 of several terminal currents and a graph 430 of a field current, according to the embodiment of FIG. 4A. FIG. 4C includes a graph 420 of the magnitudes of a negative-sequence current and the field current and a graph 450 of a ratio of the two currents.

Figure 5:
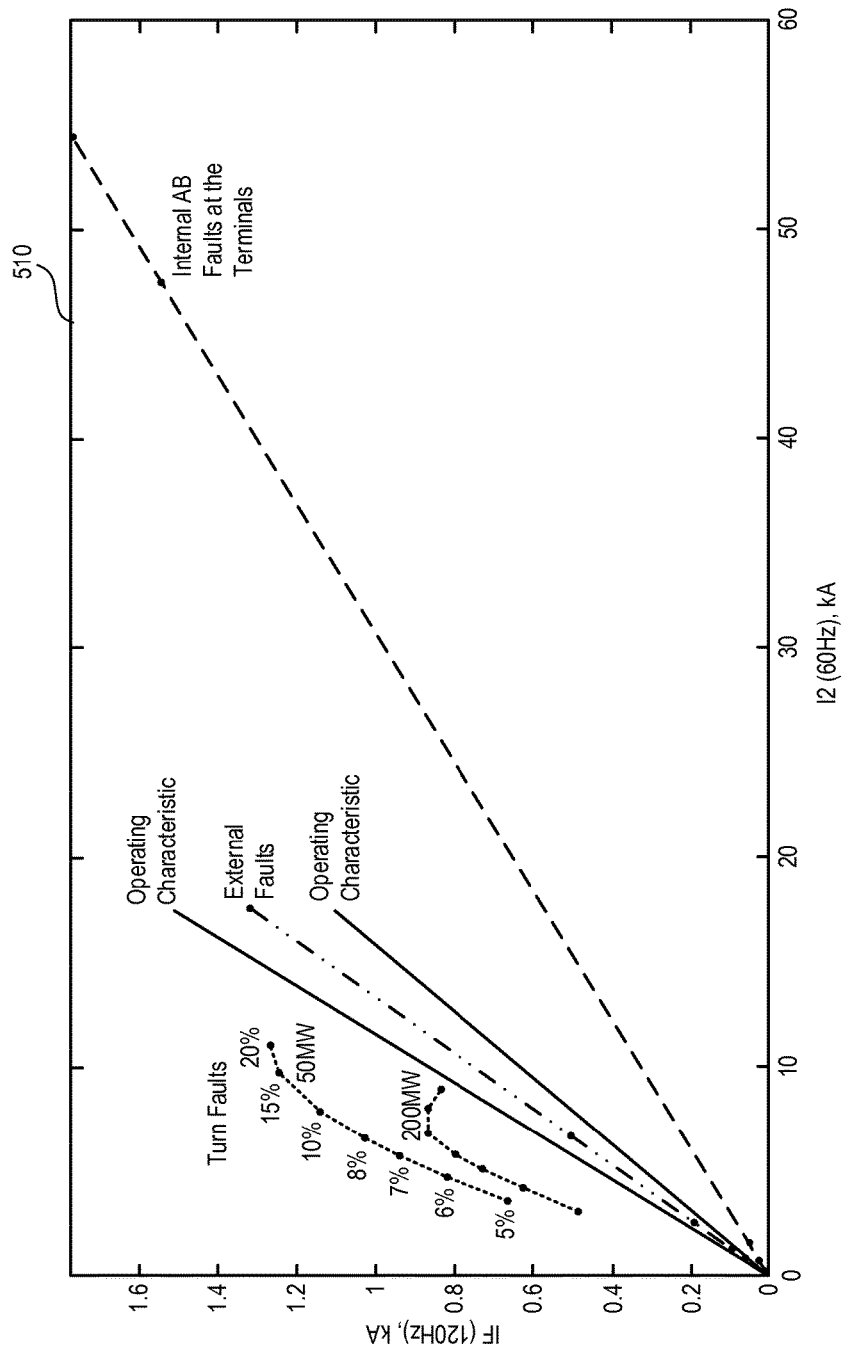
FIG. 5 is a graph showing external faults, internal turn faults, internal phase faults, and an operating characteristic according to a negative-sequence current and a double-frequency field current, according to one embodiment.

FIG. 5 includes a graph 510 of the ratio of the magnitudes of the negative-sequence current and the field current during one or more external electrical unbalances, internal turn faults of the protected generator, internal phase faults of the protected generator, and a 60SF operating characteristic, according to one embodiment. FIG. 5 illustrates twenty-two distinct internal fault cases of a single protected generator according to the following criteria: Each fault was run for a 50 MW and a 200 MW load. Turn-faults were simulated at 5%, 6%, 7%, 8%, 10%, 15%, and 20% of the winding, and internal phase faults were simulated at the machine terminals with 0 ohms, 5 ohms, 10 ohms, and 25 ohms of resistance between the phases.

The line representing the ratio values associated with an external electrical unbalance is an approximately straight line, and corresponds to a transformation ratio or stator field ratio value, that is approximately equal to a 13.4:1, the ratio between the negative-sequence current and the field current of the protected generator. The lines representing turn faults of the protected generator are above the line representing similar data for external electrical unbalances associated with the protected generator. As can be observed, the magnitude of the field current may be greater in the case of one or more turn faults of the protected generator.

The line representing the negative-sequence and field currents of the protected generator during at least one internal phase faults of the protected generator may be disposed below the line representing similar values during one or more external electrical unbalances of the protected generator. As can be observed in the figure, the magnitude of the negative-sequence current may be greater than the magnitude of a similar negative-sequence current of the protected generator without at least one phase fault.

The solid lines illustrate possible operating characteristics In various embodiments, the system may trip one or more breakers, or otherwise report a fault, for ratio values outside of the two solid lines and may prevent or substantially restrict any such operation for ratio values within the two solid lines. The 60SF differential element may compare the magnitudes of the negative-sequence current and the field current. Using the 60SF differential element, the system may provide current unbalance protection between the stator and the rotor of the generator.

Figure 6:
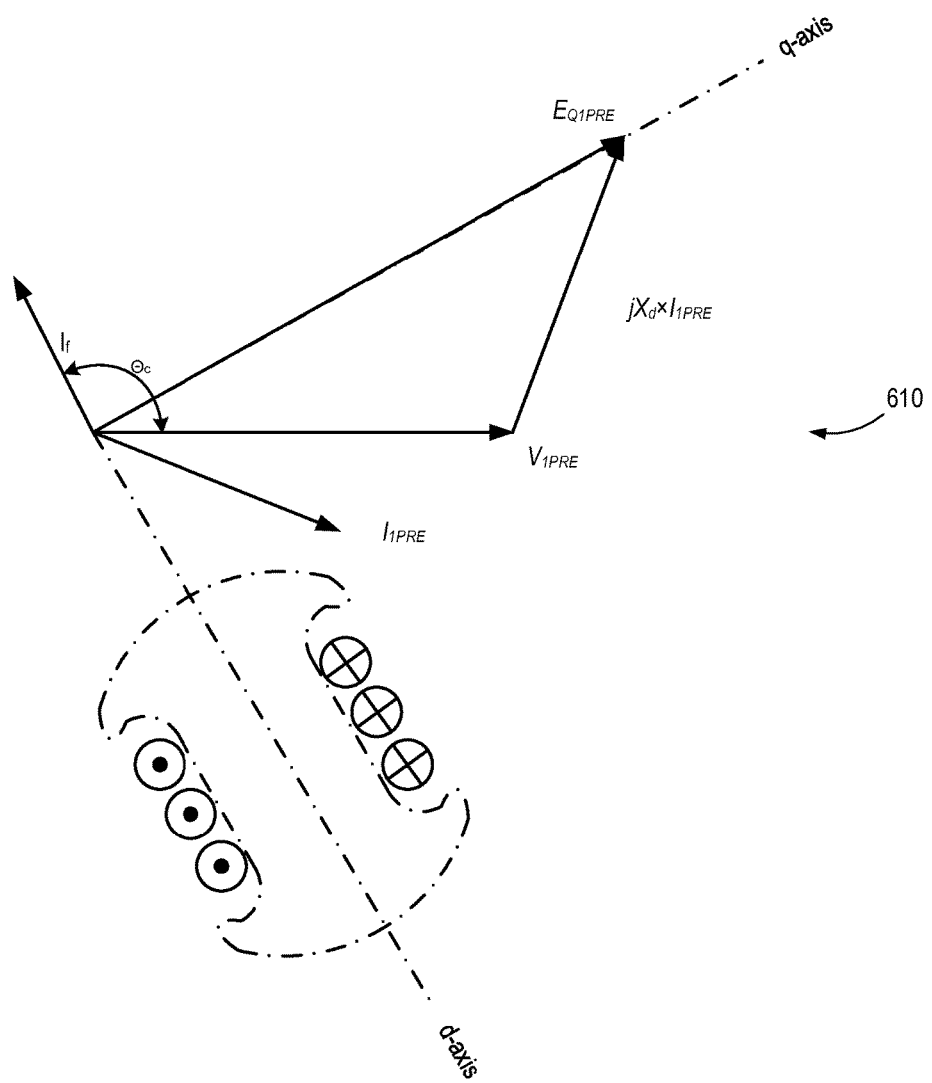
FIG. 6 is a graphical representation of a correction angle of an 87SF phasor, according to one embodiment.

FIG. 6 is a graphical representation 610 of a correction angle of a phasor associated with an 87SF differential element, according to one embodiment. The correction angle includes a q-axis line or angle of the phasor. $E_{Q1PRE}$ corresponds to the internal positive sequence electromagnetic field (EMF) of the protected generator prior to an unbalance. $V_{1PRE}$ corresponds to a positive-sequence voltage of the protected generator prior to an unbalance, such as an external electrical unbalance. $I_{1PRE}$ corresponds to a positive-sequence current prior to an unbalance of the protected generator. A vector $j*X_d*I_{1PRE}$ is illustrated as well, where $X_d$ corresponds to a direct axis (d-axis) reactance of the protected generator. Finally, a correction angle of the phasor includes current $I_{fd}$.

Figure 7A:
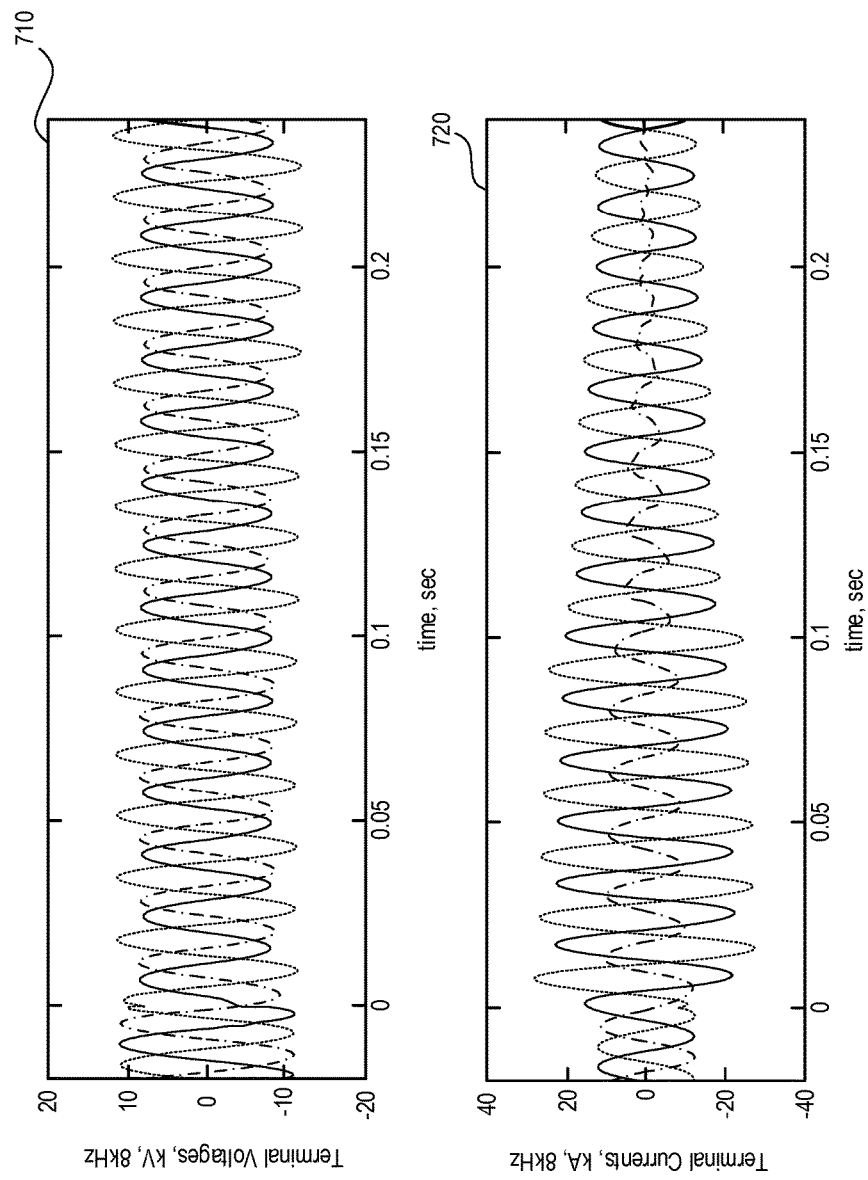
FIG. 7A is a graph of several terminal voltages and currents during an external fault followed by an A-phase turn fault, according to one embodiment.
Figure 7B:
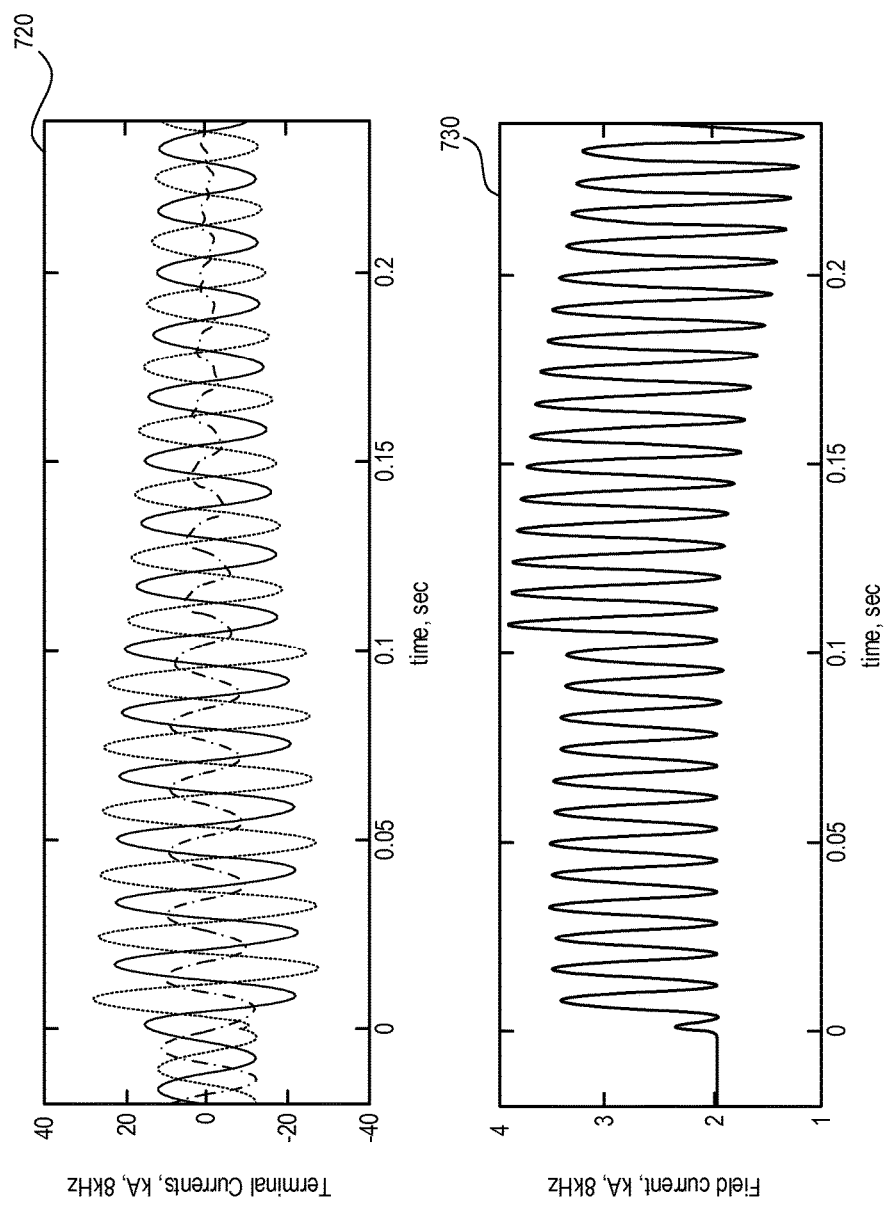
FIG. 7B is a graph of several terminal currents and a field current during an external fault followed by an A-phase turn fault, according to the embodiment of FIG. 7A.
Figure 7C:
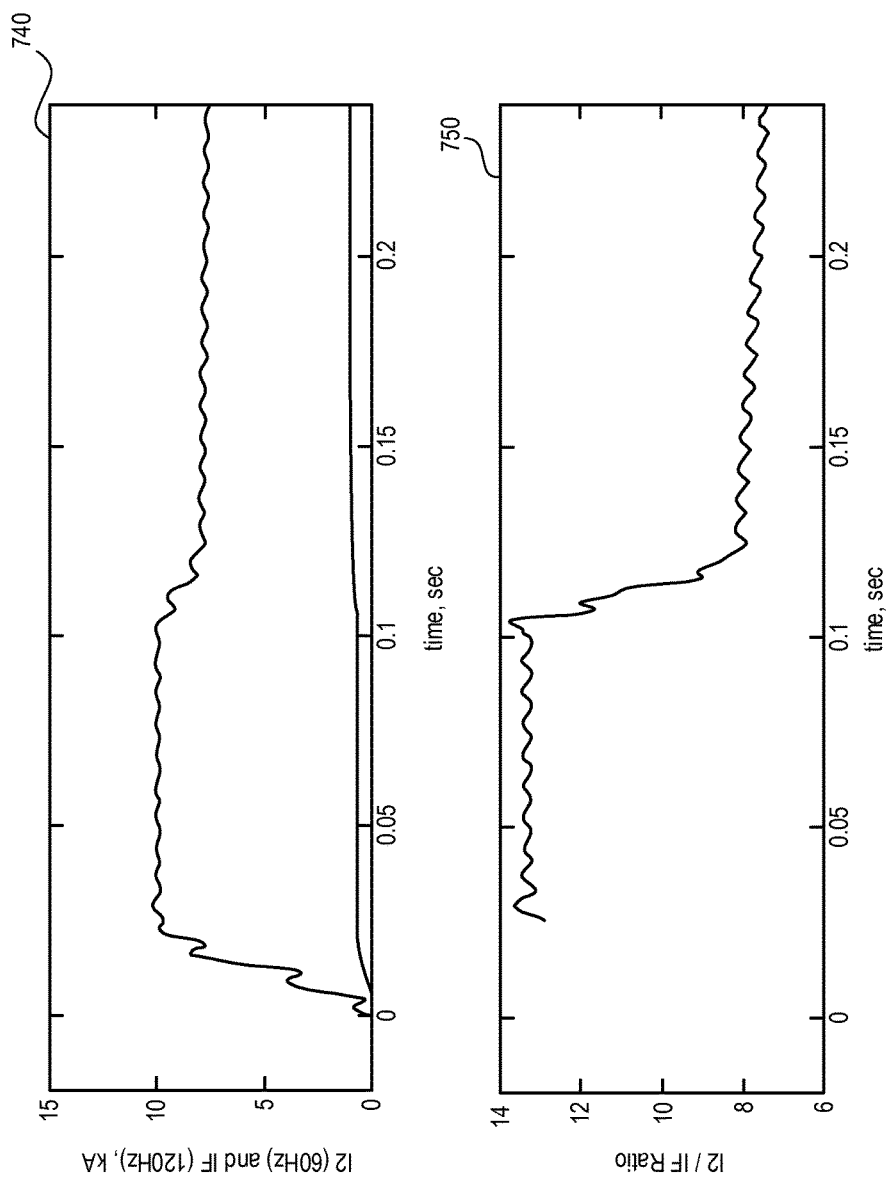
FIG. 7C is a graph of the magnitude of a negative-sequence current, the magnitude of a double-frequency field current, and a ratio of the two currents, according to the embodiment of FIG. 7A.
Figure 7D:
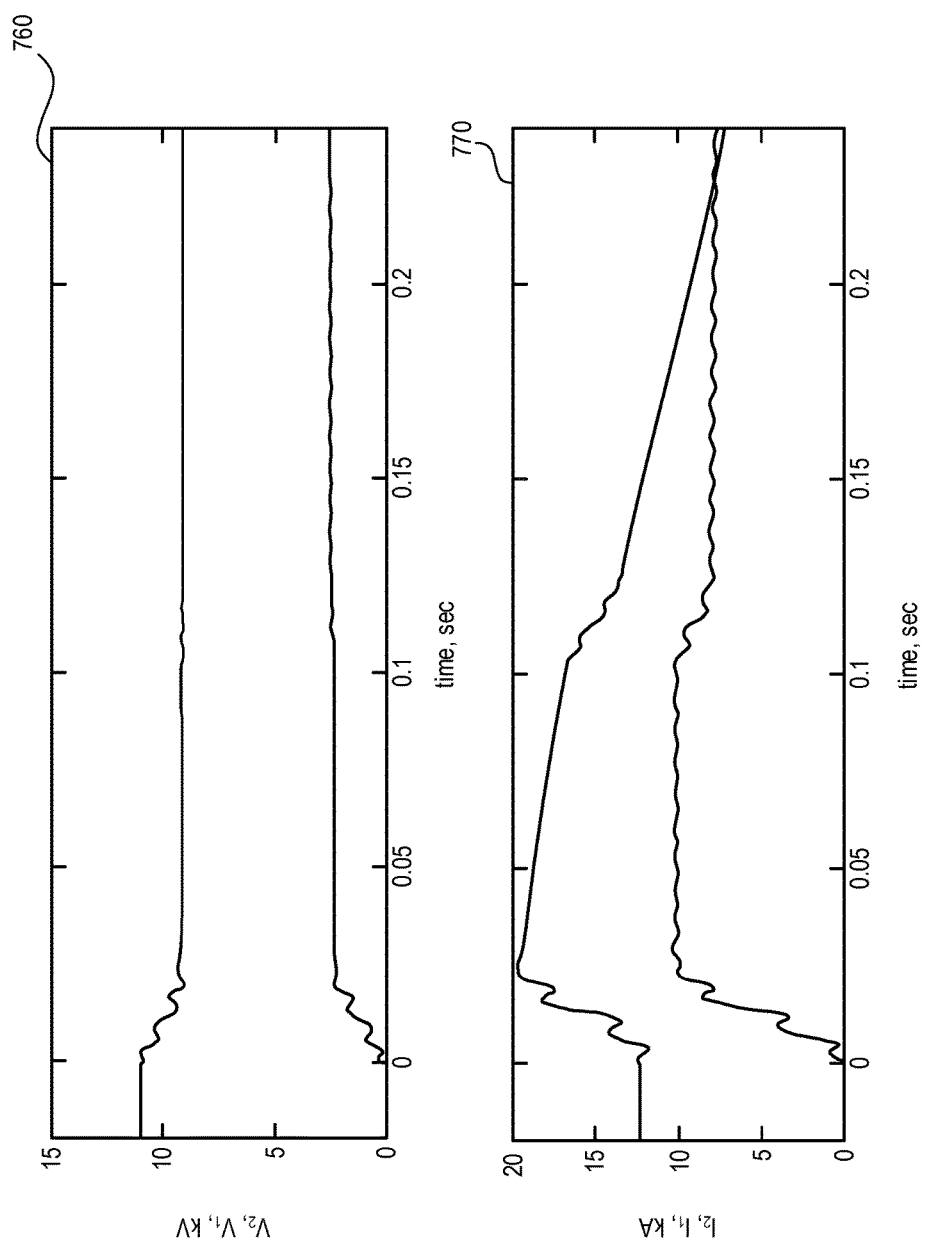
FIG. 7D is a graph of positive and negative sequence voltages and currents during an external A-phase to B-phase fault followed by an A-phase turn fault, according to the embodiment of FIG. 7A.

FIG. 7A includes a graph 710 of several voltages measured between the A-terminal and the B-terminal of the protected generator and a graph 720 of several currents measured between the same terminals, with an external A-phase to B-phase fault associated with the protected generator at time 0. The external electrical unbalance is followed by a turn fault of the A-phase of the protected generator, according to one embodiment of the protection system and the protected generator. FIG. 7B includes the graph 720 of several terminal currents of FIG. 7A and a graph of a field current 730. FIG. 7C includes a graph 740 of the magnitudes of a negative-sequence current and a field current and a graph 750 of the ratio values of the two currents. FIG. 7D includes a graph 760 of the positive and negative sequence voltages of the protected generator and a graph 770 of the positive and negative sequence currents of the protected generator.

FIGS. 7A-7D illustrate selected signals for an internal turn fault value of 5% of windings of the A-phase of the protected generator. The turn fault value is shown with an external electrical unbalance associated with the protected generator. In FIGS. 7A-7D, the protected generator was loaded with a 200 MW load. FIG. 7C illustrates that the negative-sequence current and field current ratio values noticeably changes following the turn fault at 0.1 seconds.

Figure 8A:
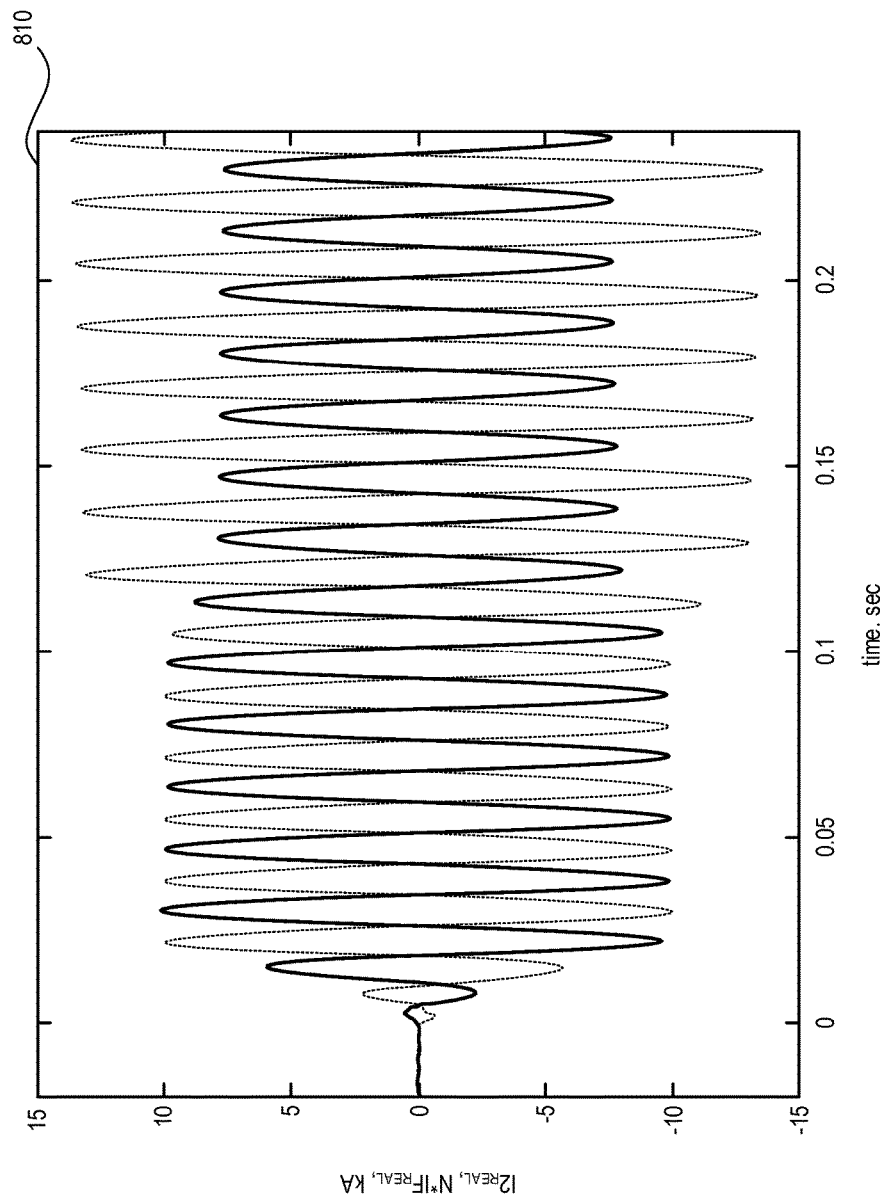
FIG. 8A is a graph of a field current compensated for an effective transformation ratio, a phase angle difference, and a negative-sequence current during an external fault followed by an A-phase turn fault, according to one embodiment.

FIG. 8A is a graph 810 of a field current normalized by a stator field ratio value, and a negative-sequence current, the two currents with a phase angle difference of 90 degrees. The two currents are illustrated with an external electrical unbalance associated with the protected generator at 0 seconds and a turn fault of the A-phase at 0.1 seconds, according to one embodiment. FIG. 8A shows how the two phasors of the stator and rotor electrical values may be balanced during the external fault. In the figure the two phasors of the stator and rotor electrical values include approximately equal magnitudes and a phase difference that is approximately equal to 90 degrees. FIG. 8B is a graph 820 of an 87SF differential component operating characteristic, according to the system embodiment of FIG. 8A.

FIGS. 7A-8B illustrate several electrical characteristics and values of one embodiment of the system and the protected generator. The values represent a simulation of a fault condition of the protected generator. Specifically, FIGS. 7A-8B illustrate currents, voltages, and at least one ratio, with an output power of the protected generator of 200 MW. The results of FIGS. 7A-8B include an external phase fault of the protected generator followed by a turn fault of the protected generator which occurred after the external phase fault approximately equal to 5 times the period associated with operation of the protected generator.

FIGS. 7A-8B also illustrate an external fault between Phase A and Phase B of the protected generator, with 1 ohm of resistance, followed by an A-phase turn fault of the protected generator. The A-phase turn fault of the protected generator is represented for a fault of 5%.

The plurality of fault conditions of FIGS. 7A-8B include a pre-existing external electrical unbalance. A pre-existing external electrical unbalance may cause the negative-sequence current and the field current of the protected generator to substantially flow within one or more windings of the protected generator. The negative-sequence current and the field current may flow prior to any occurrence of an internal fault, or turn fault, of the protected generator. A turn fault of the protected generator may be disposed in a phase that is associated with an external electrical unbalance of the protected generator.

Figure 9A:
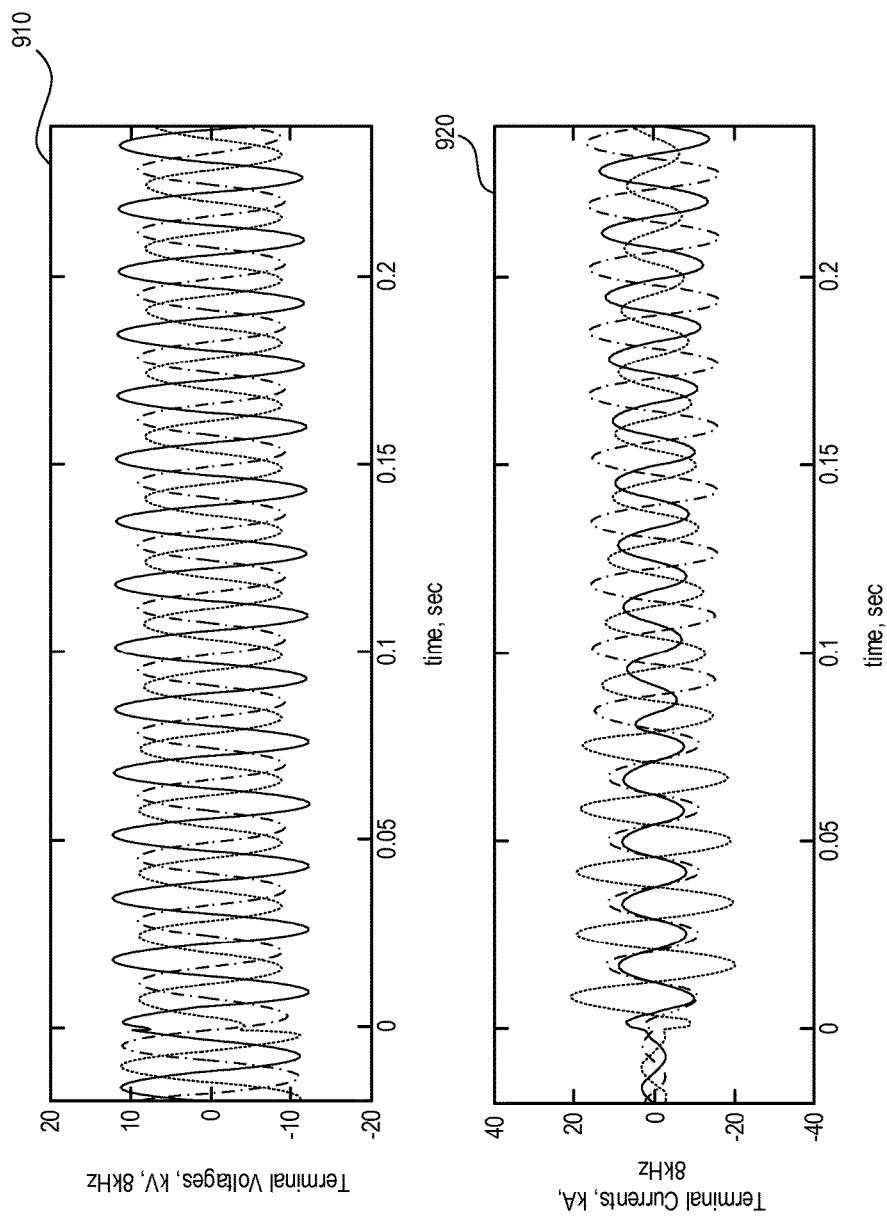
FIG. 9A is a graph of several terminal voltages and currents during an external fault that is followed by an A-phase turn fault, according to one embodiment.
Figure 9B:
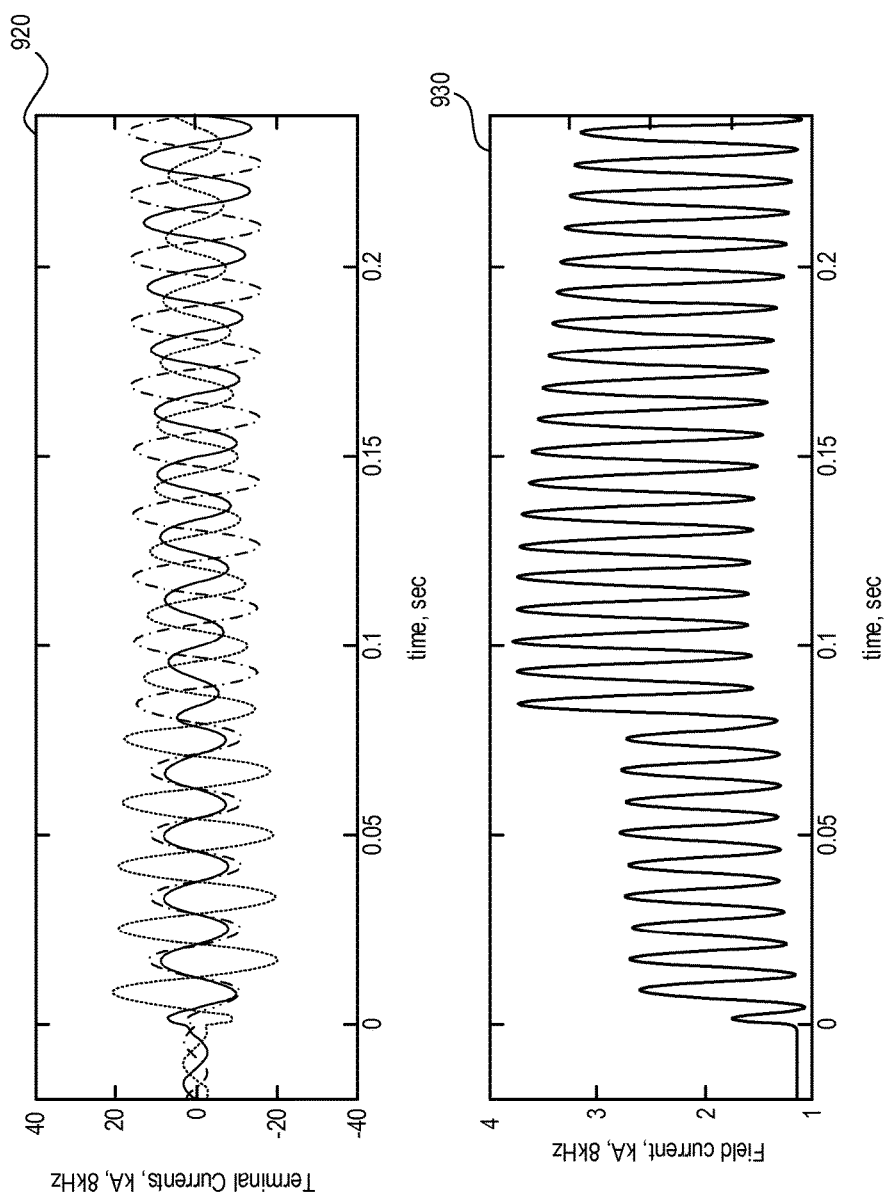
FIG. 9B is a graph of several terminal currents and a field current during an external B-phase to C-phase fault that is followed by an A-phase turn fault, according to the embodiment of FIG. 9A.
Figure 9C:
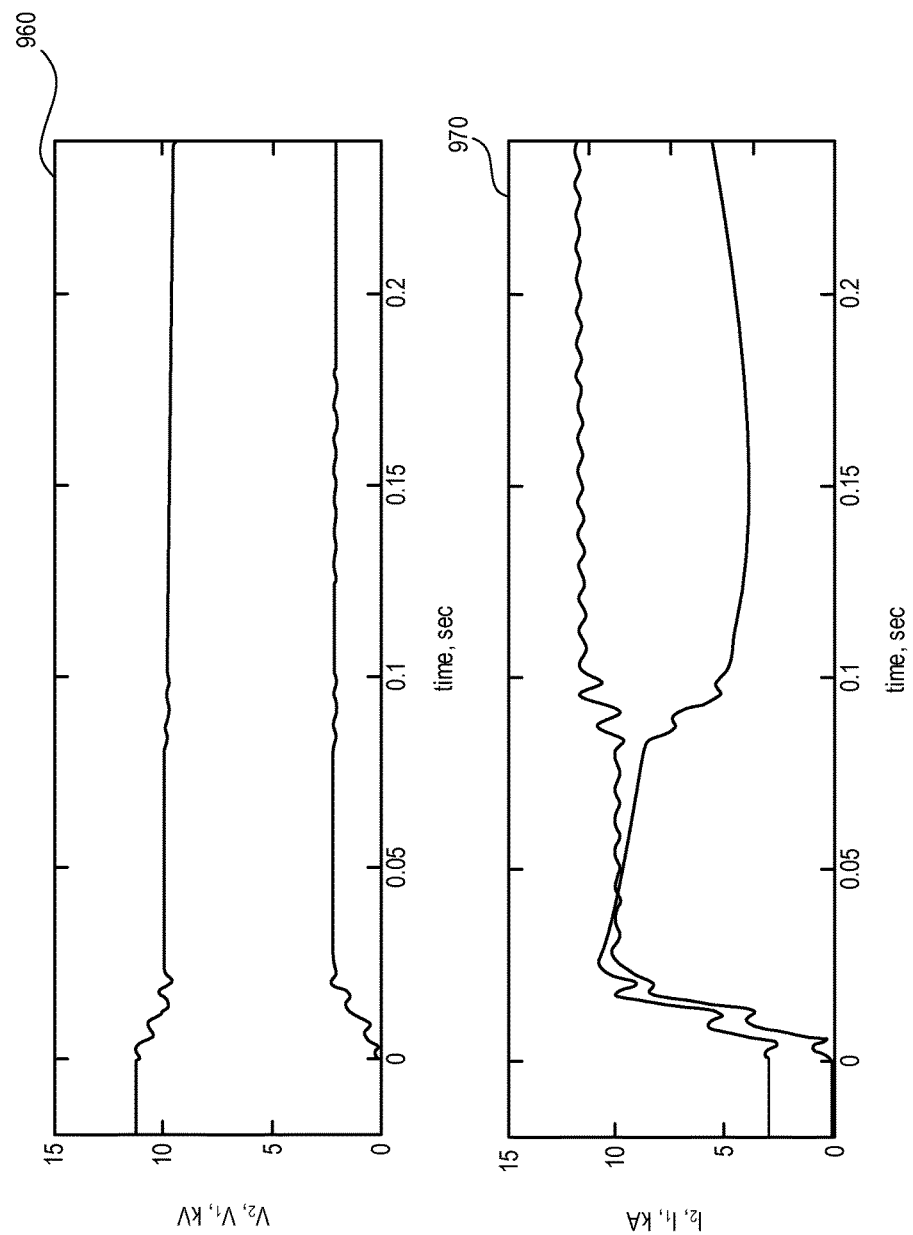
FIG. 9C is a graph of positive and negative sequence voltages and currents during an external B-phase to C-phase fault that is followed by an A-phase turn fault, according to the embodiment of FIG. 9A.
Figure 9D:
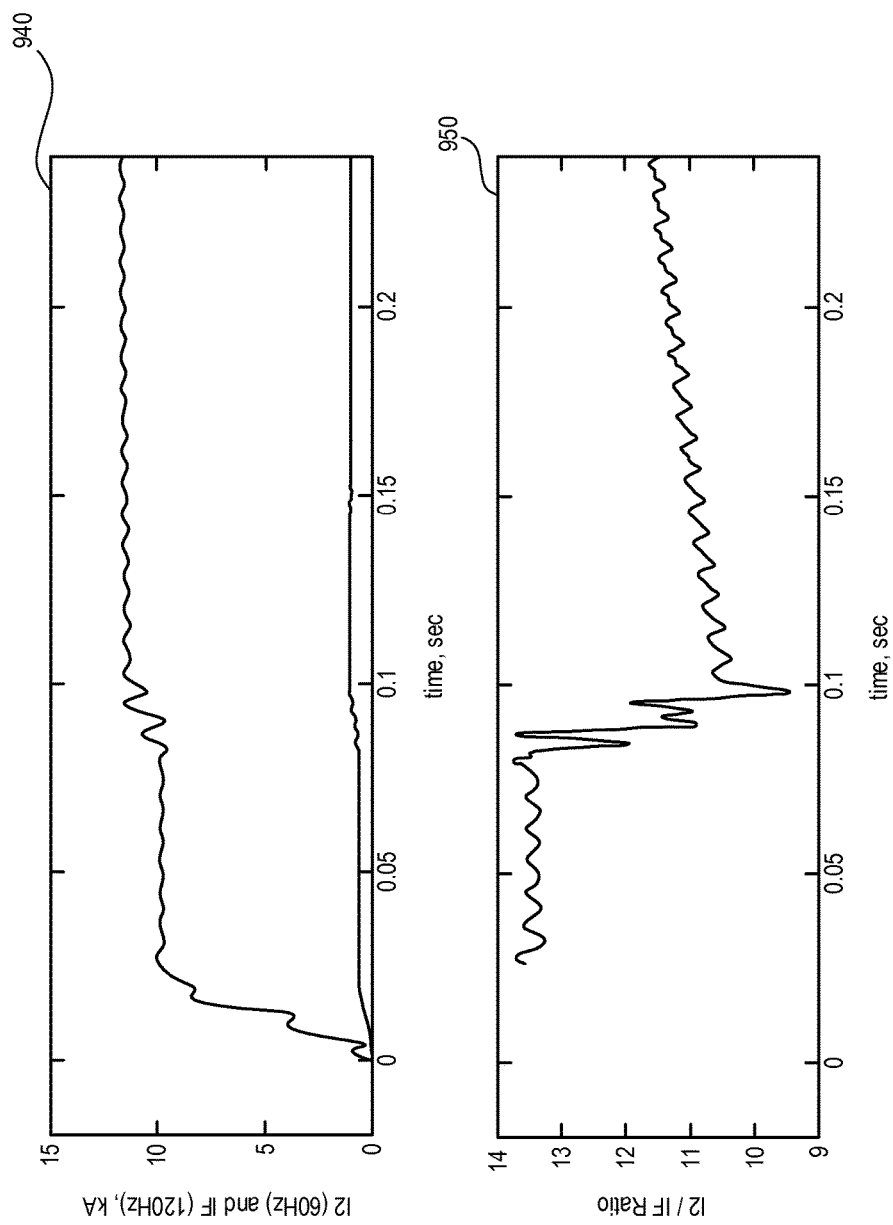
FIG. 9D is a graph of the magnitude of a negative-sequence current, the magnitude of a double-frequency field current, and a ratio of the two currents during an external B-phase to C-phase fault that is followed by an A-phase turn fault, according to the embodiment of FIG. 9A.

FIG. 9A includes a graph 910 of several voltages of the protected generator and a graph 920 of several currents of the same terminals, with an external B-phase to C-phase fault at 0 seconds, followed by an A-phase turn fault at 0.1 seconds, according to one embodiment. FIG. 9B includes the graph 920 of several terminal currents of FIG. 9A and a graph 930 of a field current. FIG. 9C includes a graph 960 of the positive and negative sequence voltages of the protected generator and a graph 970 of the positive and negative sequence currents, according to the embodiment of FIG. 9A. FIG. 9D includes a graph 940 of the magnitudes of a negative-sequence current and the field current and a graph 950 of the ratio of the two currents.

Figure 10:
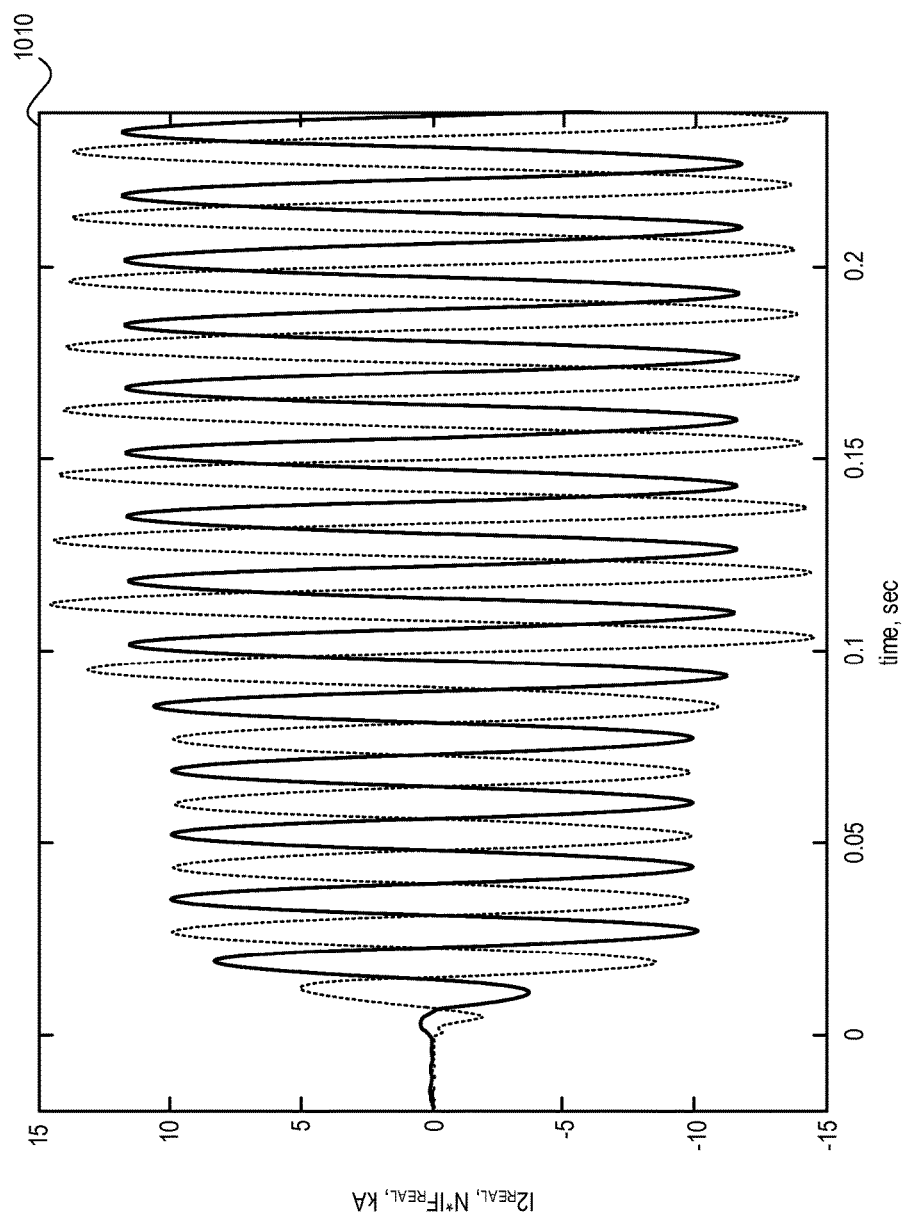
FIG. 10 is a graph of a field current and the magnitude of a negative-sequence current, the field current compensated for an effective transformation ratio and for a phase angle difference, with both currents graphed during an external B-phase to C-phase fault that is followed by an A-phase turn fault, according to one embodiment.
Figure 11:
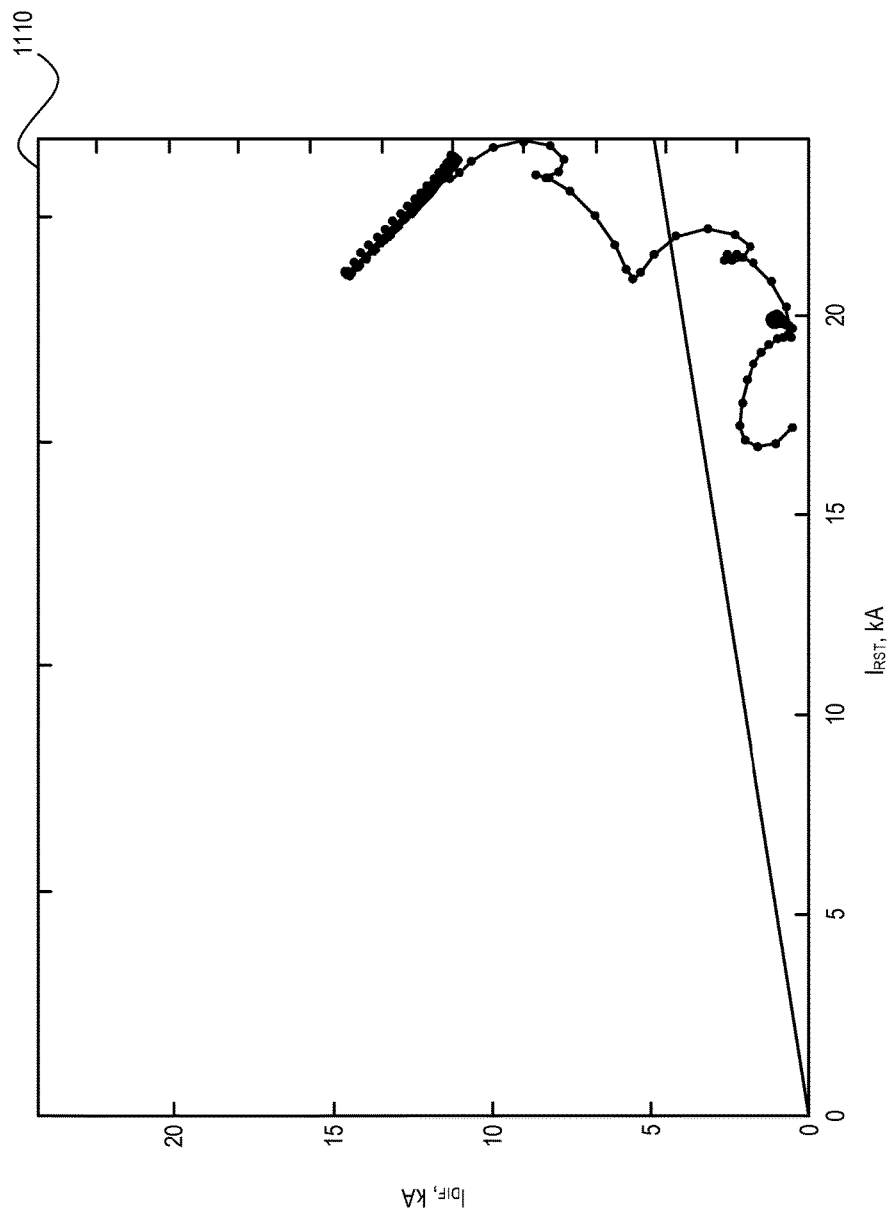
FIG. 11 is a graph of an 87SF differential element operating characteristic during an external B-phase to C-phase fault that is followed by an A-phase turn fault, according to the embodiment of FIG. 10.

FIG. 10 includes a graph 1010 of the negative-sequence current and a field current with a magnitude normalized by a stator field ratio value associated with the protected generator and the phase angle difference compensated for, according to the embodiment of FIG. 9A. FIG. 11 is a graph 1110 of an operating characteristic of an 87SF differential component during an external electrical unbalance associated with the protected generator and an A-phase turn fault of the protected generator, as per FIG. 9A. The ratio value illustrated in FIG. 11 changes moderately from 13.4 in FIG. 9D, to approximately 10 in FIG. 11. However, the phase angles of the negative-sequence and field currents may shift during the turn fault (shown in FIG. 10) and create a phase angle difference between the two currents. In some embodiments of the system, this may result in a differential value of about 12 kA, as may be observed in the graph 1110.

FIGS. 9-11 also show an external fault between the B-phase and the C-phase of the protected generator, with 1 ohm of resistance, followed by an A-phase turn fault of the protected generator. The A-phase turn fault of the protected generator is represented for a fault of 5%.

Figure 12A:
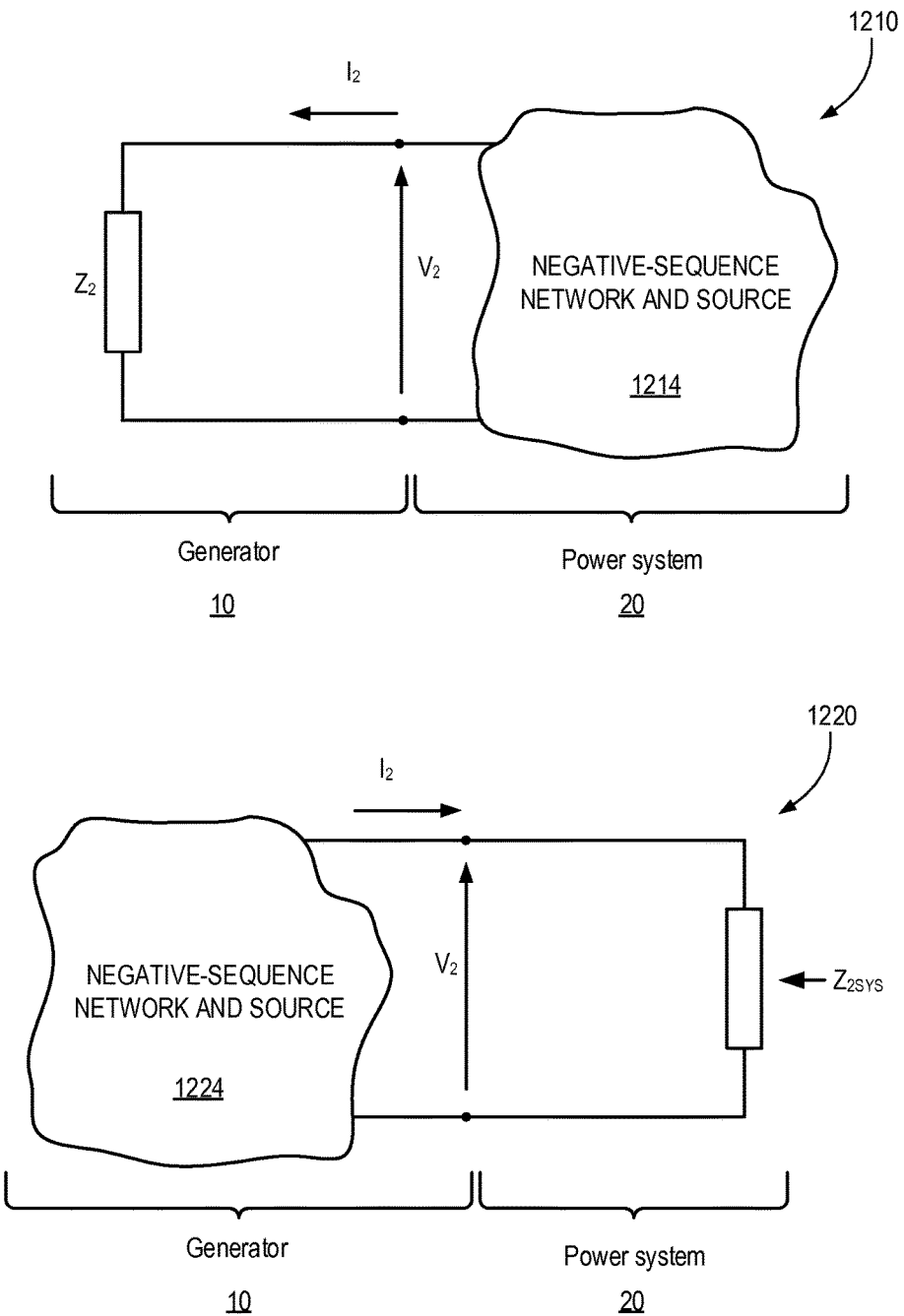
FIG. 12A is a diagram of negative sequence voltage and current during system faults and during generator faults.
Figure 12B:
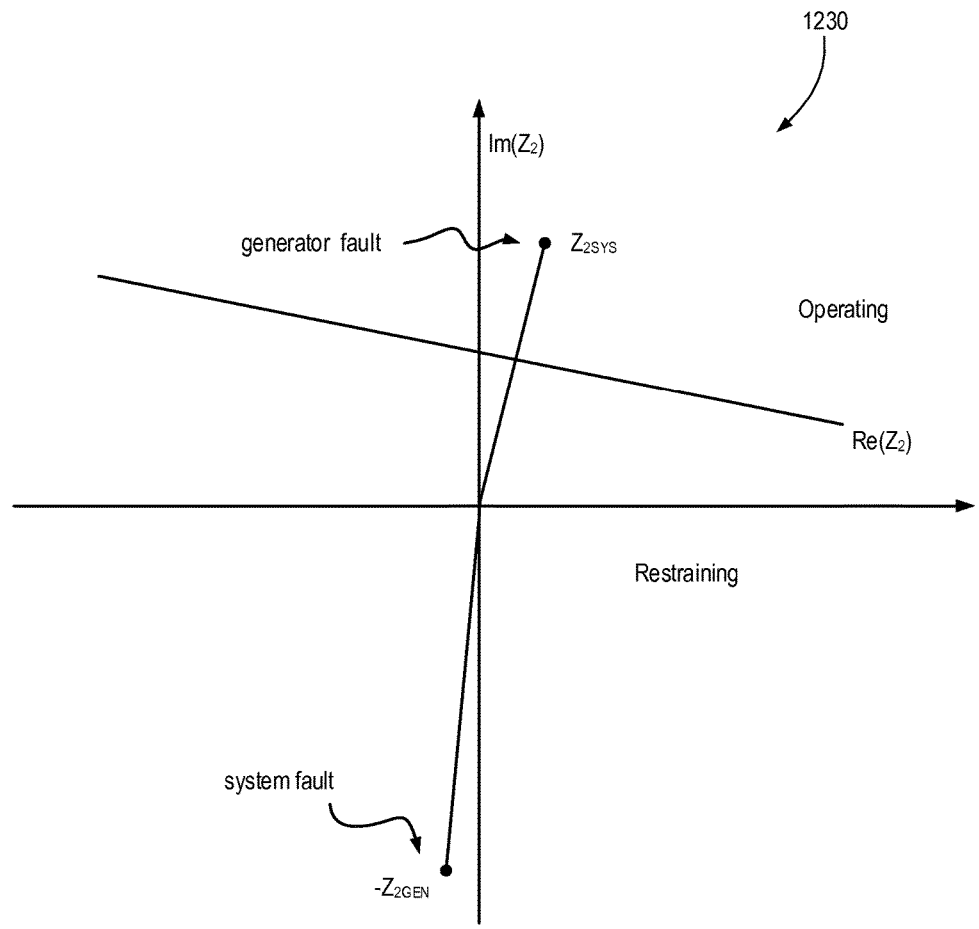
FIG. 12B is a graph of a negative-sequence impedance during a system fault and during a stator turn fault, according to one embodiment.

FIG. 12A includes two measurement diagrams 1210, 1220 of the protected generator 10, power system 20, and the corresponding negative-sequence networks and sources 1214, 1224. The measurement diagrams 1210, 1220 may facilitate measurement of electrical characteristics of a protected generator 10 according to external electrical unbalances and faults associated with the protected generator 10. The measurement diagrams 1210, 1220 illustrate impedances $Z_2$ of and $Z_{2SYS}$ of the protected generator and may also illustrate the measurement polarity for voltage $V_2$, and $I_2$. FIG. 12B is a graph 1230 of the real and imaginary components $Re(Z_2)$ and $IM(Z_2)$ of a measured negative-sequence impedance $Z_{2GEN}$ during an external electrical unbalance and $Z_{2SYS}$ during a stator turn fault associated with a protected generator 10, according to one embodiment.

Figure 13A:
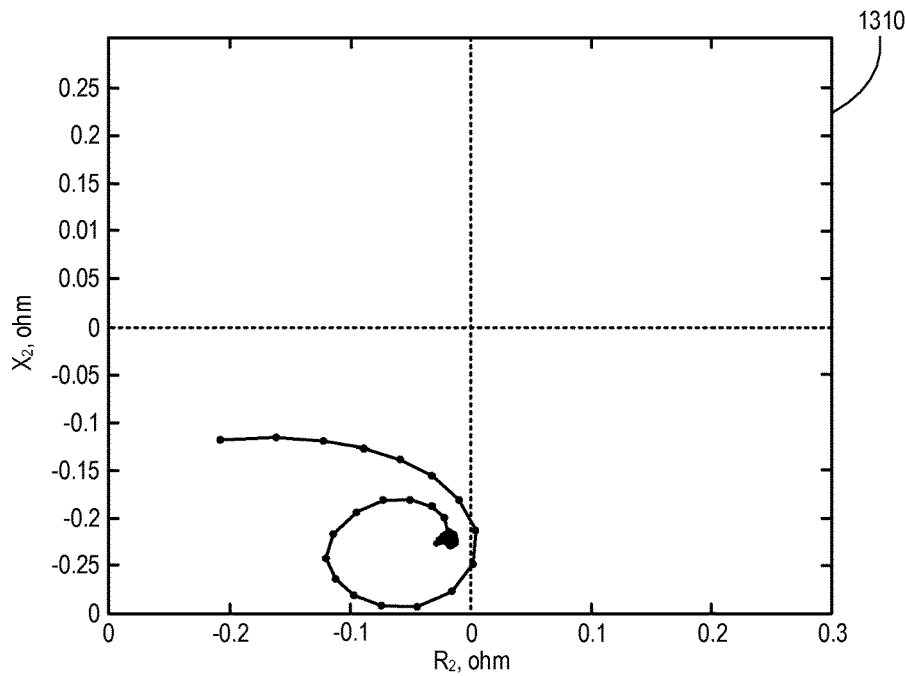
FIG. 13A is a graph of a negative-sequence impedance during an external fault, according to the embodiment of FIG. 2A.
Figure 13B:
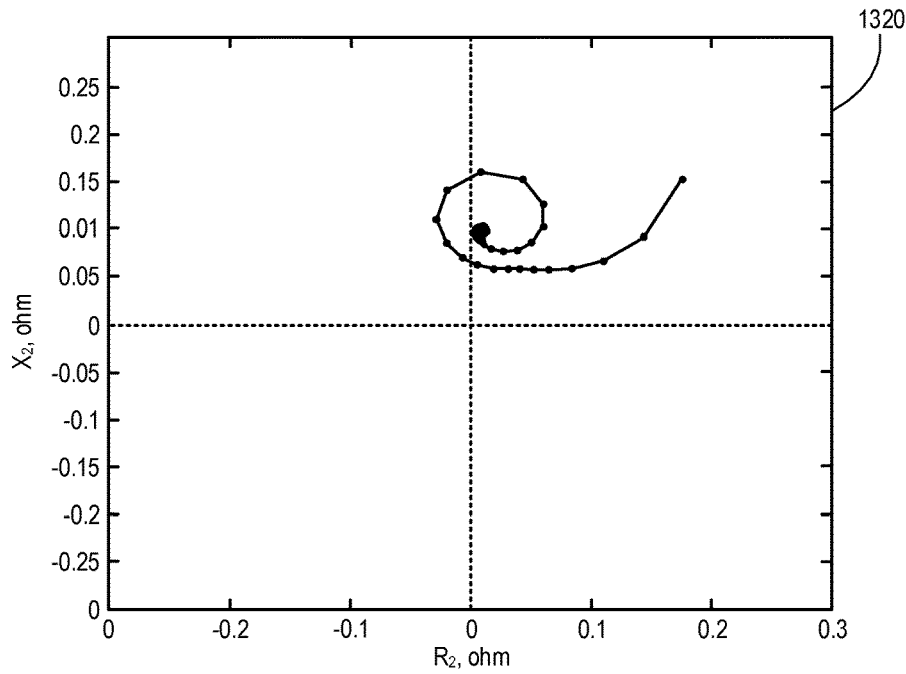
FIG. 13B is a graph of a negative-sequence impedance during an internal turn fault, according to the embodiment of FIG. 4A.

FIG. 13A is a graph 1310 of a measured negative-sequence impedance $X_2$ of the protected generator associated with an external electrical unbalance, according to the embodiment of FIG. 2A. FIG. 13B is a graph 1320 of a measured negative-sequence impedance $X_2$ of the protected generator associated with an internal electrical unbalance, according to the embodiment of FIG. 4A.

Figure 14:
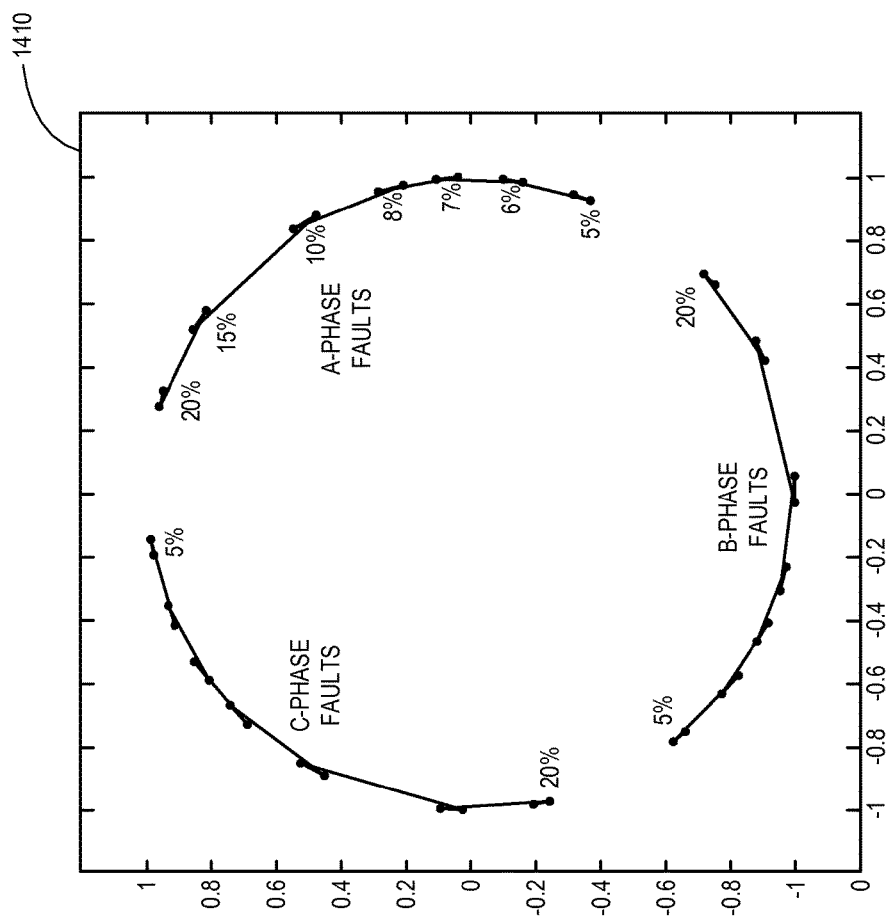
FIG. 14 is a graph of a phase angle difference between a positive sequence voltage and a negative sequence current advanced by 90 degrees with turn faults of varying percentages occurring in various phases, according to one embodiment.

FIG. 14 is a graph 1410 of a normalized phase angle difference of a positive sequence voltage and a negative sequence current advanced by 90 degrees of a protected generator according to various turn fault values of each stator phase of the protected generator, according to one embodiment.

Figure 15:
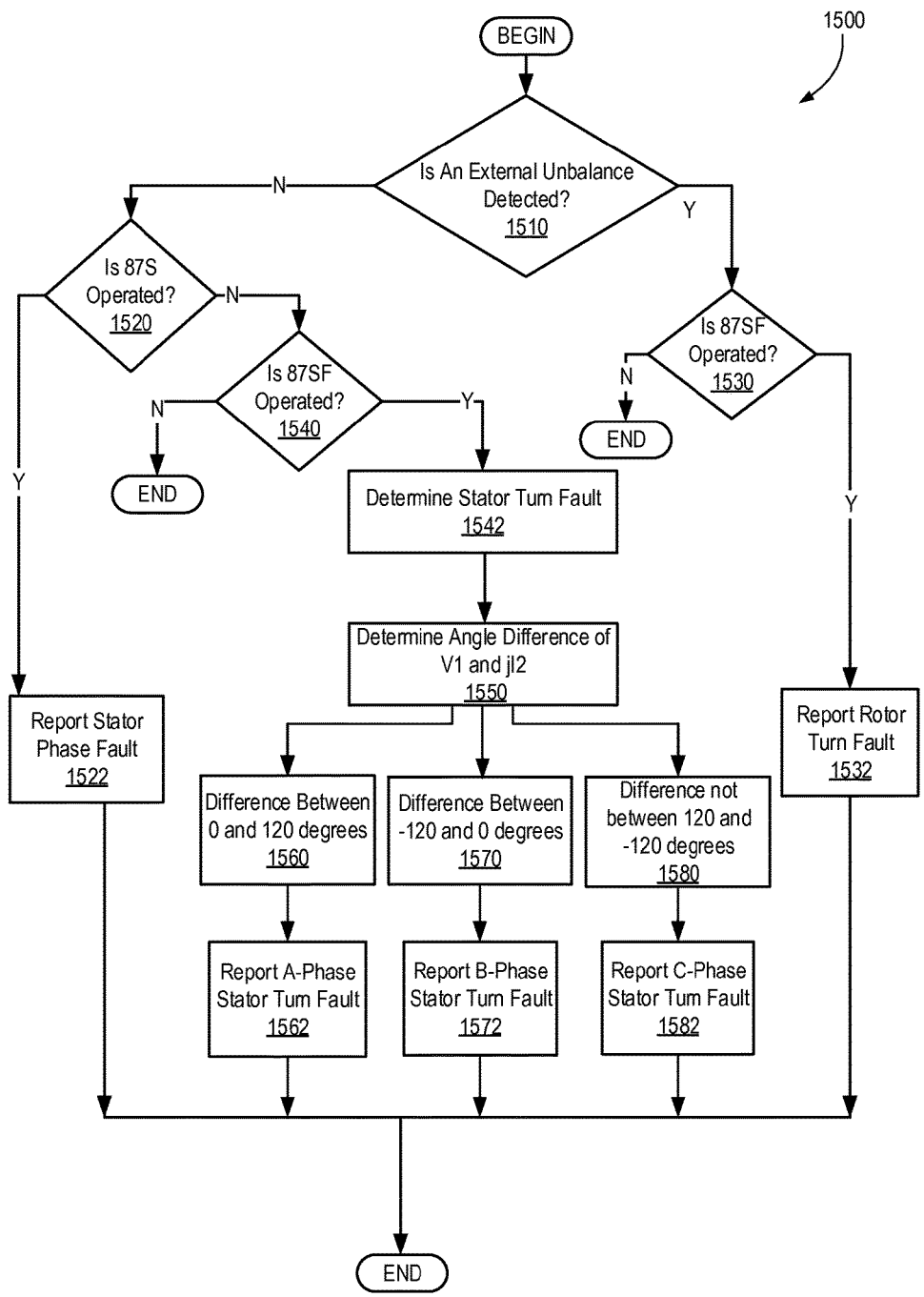
FIG. 15 is a flow chart of a method for locating one or more faults of a protected generator, according to one embodiment.

FIG. 15 is a flow chart of a method 1500 for detecting and or locating faults associated with a protected generator, according to one embodiment. Various steps not shown may include determining, deriving, receiving, calculating, and/or recording one or more electrical values/characteristics associated with a protected electric power generator.

As illustrated, the method includes determining if an external electrical unbalance is associated with the protected generator 1510. If so then the system may determine if an 87SF differential component is operating 1530. Following a determination that an external electrical unbalance is associated with the protected generator 1510 and that the 87SF differential component is operating 1530, the system may report a rotor turn fault associated with the protected generator 1532.

If an external electrical unbalance is not detected 1510, and an 87S differential component has operated 1520, then the system may report a stator phase fault 1522. If the 87S differential component has not operated 1520 and an 87SF has also operated 1540, then the system may determine and/or report a stator turn fault 1542.

The system may then determine an angle difference and/or or a phase angle difference between two electrical values associated with the protected generator 1550, such as a phase angle difference of a positive-sequence voltage $V_1$ and a negative-sequence current $j*I_2$.

The system may then report a stator turn fault associated with a stator phase of the protected generator 1562, 1572, and 1582, based on the value of the determined phase angle difference. For example, the system may report an A-phase stator turn fault 1562 for a phase angle difference between 0 and 120 degrees 1560. The system may report a B-phase stator turn fault 1572 for a phase angle difference between −120 and 0 degrees 1570. The system may report a C-phase stator turn fault 1582 if the determined phase angle difference is greater than +120 degrees and less than −120 degrees 1580. In various embodiments, the system may report a determined stator field ratio value and/or a turn fault value as part of reporting a stator turn fault 1562, 1572, and 1582.

Figure 16:
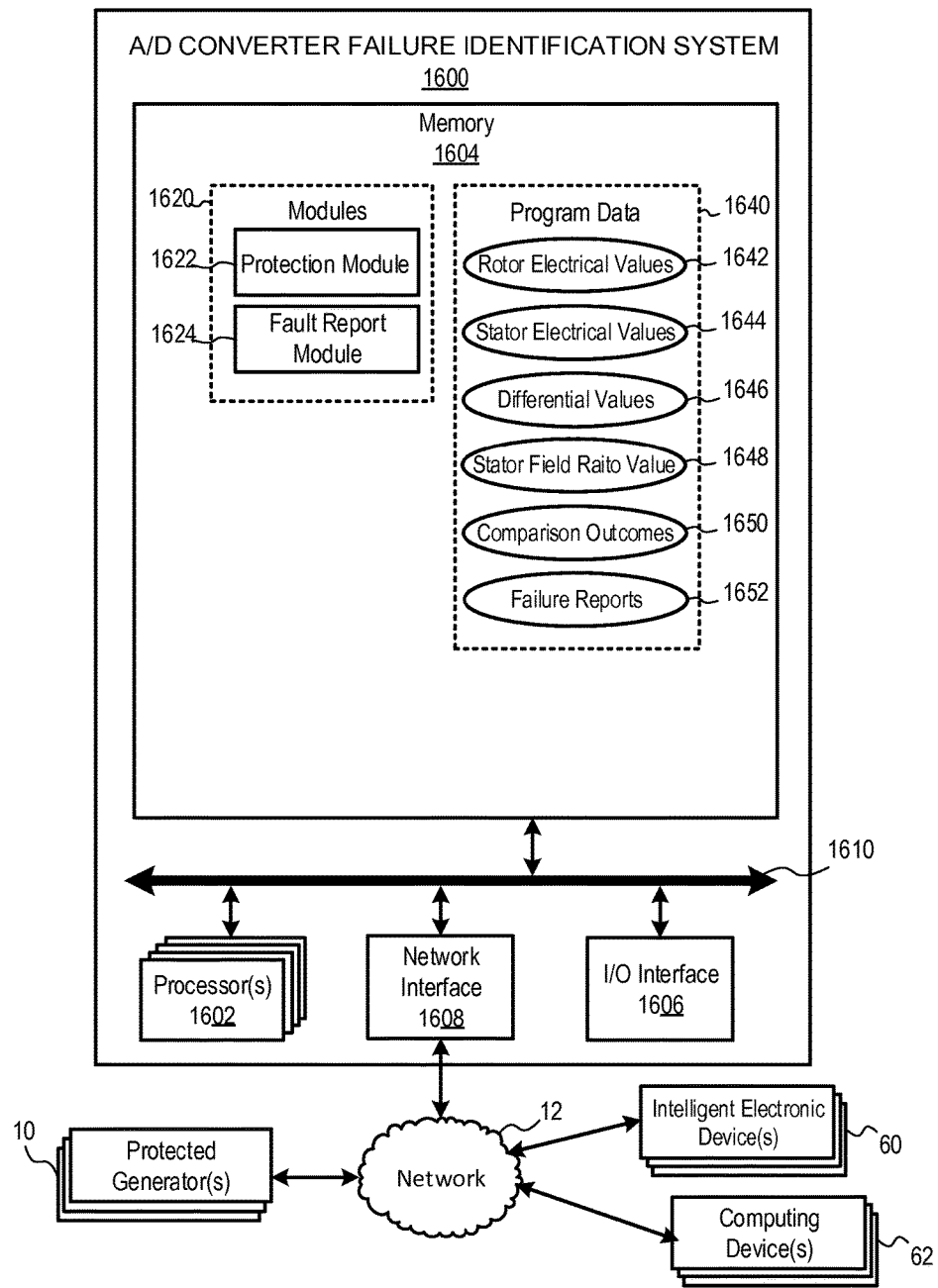
FIG. 16 is a system for detecting faults of an electric power generator, according to one embodiment.

FIG. 16 illustrates one example of a system 1600 for detecting faults of an electric power generator. The system 1600 for detecting faults of an electric power generator may include a system bus 1610, one or more processors 1602, a memory 1604, an I/O interface 1606, and a network interface 1608. The memory 1604 and may be in electrical communication with the one or more processors 1602, via a system bus 1610, to store program data 1640.

The one or more processors 1602 may include one or more general purpose devices, such as an Intel®, AMD®, or other standard microprocessor. The one or more processors 1602 may include a special purpose processing device, such as ASIC, SoC, SiP, FPGA, DSP, PAL, PLA, FPLA, PLD, or other customized or programmable device. The one or more processors 1602 perform distributed (e.g., parallel) processing to execute or otherwise implement functionalities of the present embodiments. The one or more processors 1602 may run a standard operating system and perform standard operating system functions. It is recognized that any standard operating systems may be used, such as, for example, Microsoft® Windows®, Apple® MacOS®, Disk Operating System (DOS), UNIX, IRJX, Solaris, SunOS, FreeBSD, Linux®, ffiM® OS/2® operating systems, and so forth.

The memory 1604 may include static RAM, dynamic RAM, flash memory, one or more flip-flops, ROM, CD-ROM, DVD, disk, tape, or magnetic, optical, or other computer storage medium. The system bus 1610 may facilitate communication and/or interaction between the other components of the system, including the one or more processors 1602, the memory 1640, the input/output interface 1660, and the network interface 1608.

The modules 1620 may include all or portions of other elements of the system 1600. The program modules 1620 may run multiple operations concurrently or in parallel by or on the one or more processors 1602. In some embodiments, portions of the disclosed modules, components, and/or facilities are embodied as executable instructions embodied in hardware or in firmware, or stored on a non-transitory, machine-readable storage medium. The instructions may comprise computer program code that, when executed by a processor and/or computing device, cause a computing system to implement certain processing steps, procedures, and/or operations, as disclosed herein. The modules, components, and/or facilities disclosed herein, may be implemented and/or embodied as a driver, a library, an interface, an API, FPGA configuration data, firmware (e.g., stored on an EEPROM), and/or the like. In some embodiments, portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like. Accordingly, the modules disclosed herein may be referred to as controllers, layers, services, engines, facilities, drivers, circuits, and/or the like.

The system memory 1604 may also include program data 1640. Data generated by the system 1600, such as by the modules 1620, may be stored on the system memory 1604, for example, as stored program data 1640. The stored program data 1640 may be organized as one or more databases.

The input/output interface 1606 may facilitate interfacing with one or more input devices and/or one or more output devices. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

The network interface 1608 of the system may be configured to communicate over a communication network 12 with one or more Intelligent Electronic Devices 60 and/or computing devices 62. The network 12 is broadly construed to encompass data lines from CTs, PTs, and/or other direct monitoring and measurement equipment associated with the systems described herein. Program and/or module data 1640 may be received via the network interface, over a network 12 from an appropriate device, such as an IED 60 or a computing device 62. The program data 1640 may be received as user input manually entered into a user interface of an appropriate IED 60 or computing device 62. The program data 1640 may also be received from one or more protected generators 10 through the network interface 1608, or through the I/O interface 1606.

The system modules 1620, may include a protection module 1622, as described herein, to detect one or more faults of the at least one protected generator 10, and a fault report module 1624 to report any detected faults to any suitable monitoring or safety systems. As described previously herein, the protection module may determine various values, outcomes, and/or, reports corresponding to the protected generator(s) 10. For example, the protection module 1622 may determine the following, at least one rotor electrical value 1642, at least one stator electrical value 1644, various differential values 1646, a stator field ratio value 1648, one or more comparison outcomes 1650, and may create error reports 1652 based on the determined values of the program data 1640.

Figure 17:
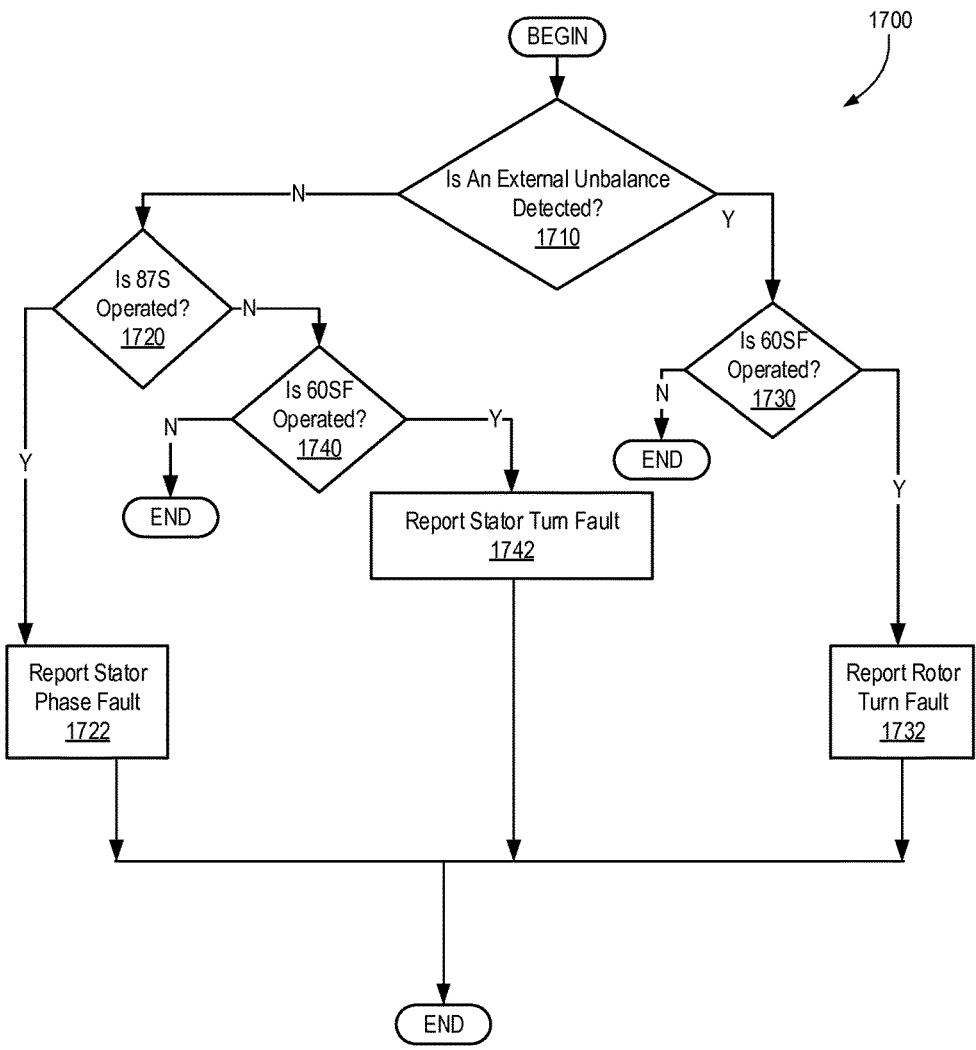
FIG. 17 is a flow chart of a method for locating one or more faults of a protected generator, according to one embodiment.

FIG. 17 is a flow chart of a method 1700 for detecting and/or locating faults associated with a protected generator, according to one embodiment. Various steps not shown may include determining, deriving, receiving, calculating, and/or recording one or more electrical values/characteristics associated with a protected electric power generator.

As illustrated, the method includes determining if an external electrical unbalance is associated with the protected generator 1710. If so then the system may determine if a 60SF differential component is operating 1730. Following a determination that an external electrical unbalance is associated with the protected generator 1710 and that the 60SF differential component is operating 1730, the system may report a rotor turn fault associated with the protected generator 1732.

If an external electrical unbalance is not detected 1710, and an 87S differential component has operated 1720, then the system may report a stator phase fault 1722. If the 87S differential component has not operated 1720 and the 60SF has operated 1740, then the system may determine and/or report a stator turn fault 1742.

Figure 18:
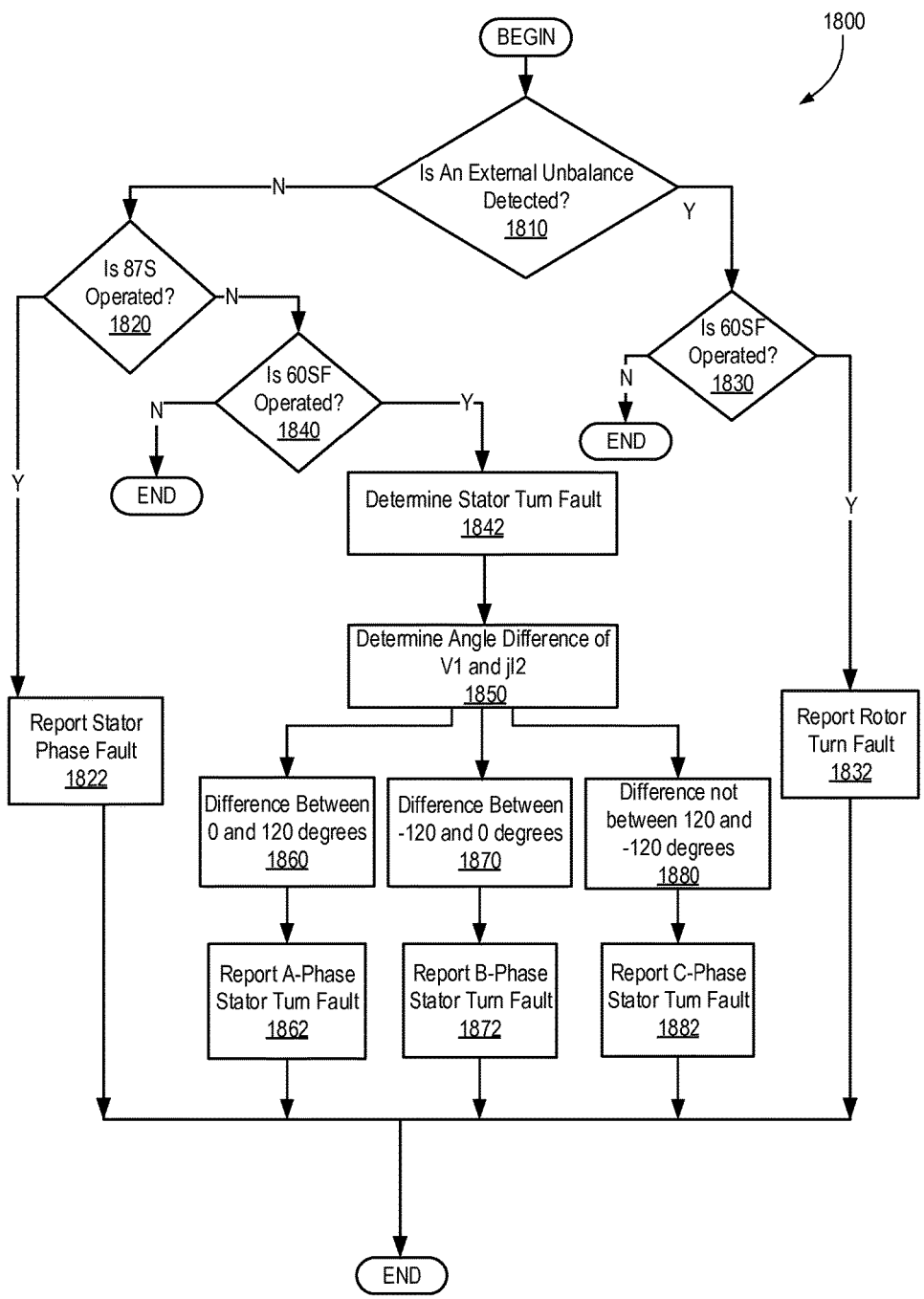
FIG. 18 is a flow chart of a method for locating one or more faults of a protected generator, according to one embodiment.

FIG. 18 is a flow chart of a method 1800 for detecting and/or locating faults associated with a protected generator, according to one embodiment. Various steps not shown may include determining, deriving, receiving, calculating, and/or recording one or more electrical values/characteristics associated with a protected electric power generator.

As illustrated, the method includes determining if an external electrical unbalance is associated with the protected generator 1810. If so then the system may determine if a 60SF differential component is operating 1830. Following a determination that an external electrical unbalance is associated with the protected generator 1810 and that the 60SF differential component is operating 1830, the system may report a rotor turn fault associated with the protected generator 1832.

If an external electrical unbalance is not detected 1810, and an 87S differential component has operated 1820, then the system may report a stator phase fault 1822. If the 87S differential component has not operated 1820 and the 60SF has operated 1840, then the system may determine and/or report a stator turn fault 1842.

The method 1800 may be used to determine a faulted phase associated with a protected generator. In such an embodiment, in step 1840 when 60SF has operated, the method may then determine and/or report a stator turn fault 1842, and continue to determine an angle difference between the positive-sequence voltage $V_1$ and the negative-sequence current $j*I_2$ 1850. The angle difference may then be used to determine the faulted phase. For example, as is illustrated in FIGS. 14 and 15, if the angle difference is between around 0 degrees and around 120 degrees 1860, an A-phase stator turn fault may be reported 1862. If the angle difference is between around −120 degrees and around 0 degrees 1870, a B-phase stator turn fault may be reported 1872. If the angle difference is between around −120 and around 120 degrees 1880, then a C-phase fault may be reported 1882.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure. The scope of the present application, should, therefore, be determined only by the following claims.

What is claimed is:

1. A system for protecting an electric power generator having a stator, a rotor, and a plurality of current transformers (CTs) and transducers, the system comprising:
    a first input configured to receive an analog signal from a first transducer indicative of a rotor current associated with the rotor of the electric power generator;
    a second input configured to receive an analog signal from a first CT indicative of a stator current associated with at least one stator phase of the electric power generator; and
    a protection module configured to:
        determine a rotor current value based on the analog signal from the first transducer indicative of the rotor current during an unbalanced condition;
        determine a negative-sequence stator current value based on the analog signal from the first CT indicative of the stator current during the unbalanced condition;
        determine a stator-rotor current difference, wherein the stator-rotor current difference comprises a difference between the determined rotor current value and the determined negative-sequence stator current value;
        determine that the stator-rotor current difference exceeds a threshold fault current value; and
        report a turn fault.

2. A system for protecting an electric power generator, comprising:
    a first input configured to receive a rotor electrical characteristic associated with a rotor of an electric power generator;
    a second input configured to receive at least one stator electrical characteristic associated with at least one stator phase of the electric power generator; and
    a protection module configured to:
        determine a rotor electrical value based on the received rotor electrical characteristic during an unbalanced condition;
        determine a negative-sequence stator electrical value based on the received at least one stator electrical characteristic during the unbalanced condition;
        determine a stator-rotor differential value, wherein the stator-rotor differential value comprises a difference between the determined rotor electrical value and the determined negative-sequence stator electrical value;
        determine that the stator-rotor differential value exceeds a threshold fault value; and
        report a fault.

3. The system of claim 2, wherein the protection module is further configured to:
    determine a turn fault value of the electric power generator based on the determined stator-rotor differential value; and
    report the determined turn fault value.

4. The system of claim 2, wherein the fault comprises a stator turn fault.

5. The system of claim 2, wherein the fault comprises a rotor turn fault.

6. The system of claim 2, wherein the fault comprises an internal series fault.

7. The system of claim 2, wherein the at least one stator electrical characteristic comprises at least one of a terminal current and a neutral side current.

wherein the rotor electrical characteristic comprises a field current associated with field windings of the rotor, wherein the determined rotor electrical value includes a rotor phasor with a rotor phasor frequency that is approximately twice an operating frequency of the generator, and wherein the determined stator electrical value includes a stator phasor with a stator phasor frequency that is approximately equal to the operating frequency of the generator.

8. The system of claim 2, wherein the protection module is further configured to:

normalize the rotor electrical value and the negative-sequence stator electrical value by multiplying one of the rotor electrical value and the negative-sequence stator electrical value by a constant associated with a turn ratio;

match a frequency of the determined rotor electrical value and a frequency of the determined negative-sequence stator electrical value by multiplying at least one of the determined rotor electrical value and the determined negative-sequence stator electrical value by a rotating vector with a rotating frequency that corresponds to an operating frequency of the electric power generator;

match a phase angle of the determined rotor electrical value and a phase angle of the determined negative-sequence stator electrical value by adjusting the phase angle of at least one of the determined rotor electrical value or the determined negative-sequence stator electrical value by a phase angle adjustment value; and determine the stator-rotor differential value based on the magnitude of a difference between a plurality of phasors of the ratio-matched electrical values, the frequency-matched electrical values, and the phase angle-matched electrical values.

9. The system of claim 8, wherein matching a frequency of the determined rotor electrical value and a frequency of the determined negative-sequence stator electrical value further comprises multiplying the determined rotor electrical value by a first rotating vector having a first rotating frequency and multiplying the determined negative-sequence stator electrical value by a second rotating vector having a second rotating frequency, and wherein a magnitude of the frequency difference of the first rotating frequency and the second rotating frequency approximately equals the operating frequency of the generator.

10. The system of claim 2, further comprising determining the phase location of a stator phase fault comprising:

determining a positive-sequence voltage based on the at least one stator electrical characteristic;

determining a negative-sequence current based on the at least one stator electrical characteristic;

determining a phase angle difference between the positive-sequence voltage and the negative-sequence current; and determining a phase location of the stator phase fault based on the determined phase angle difference of the positive-sequence voltage and the negative-sequence current.

11. The system of claim 10, wherein the protection module is configured:

to determine that the stator phase fault is on an A-phase when the determined phase angle difference between the positive-sequence voltage and the negative-sequence current advanced by 90 degrees is between 0 degrees and +120 degrees;

to determine that the stator phase fault is on an C-phase when the determined phase angle difference between the positive-sequence voltage and the negative-sequence current advanced by 90 degrees is between +120 degrees and −120 degrees; and to determine that the stator phase fault is on a B-phase when the determined phase angle difference between the positive-sequence voltage and the negative-sequence current advanced by 90 degrees is between −120 degrees and 0 degrees.

12. The system of claim 10, wherein the negative-sequence electrical value comprises a negative-sequence current, and wherein the stator-rotor differential value is determined based on the negative-sequence current of the at least one stator electrical characteristic and on a field current of the at least one rotor electrical characteristic.

13. The system of claim 12, wherein the stator-rotor differential value, $I_{OP}$, is calculated according to:

$$I_{OP} = |I_2 + N_{SF} * I_F * 1 \angle -\Theta_C|$$

where $I_2$ corresponds to the negative-sequence current based on the at least one stator electrical characteristic with an adjusted frequency equal to a base frequency of the system $N_{SF}$ corresponds to a stator field ratio value, $I_F$ corresponds to the field current with an adjusted frequency approximately equal to the base frequency of the system, and $\Theta_C$ corresponds to a shift in the field current.

14. The system of claim 13, wherein the base frequency of the system is the electrical frequency of the stator current.

15. The system of claim 13, wherein the base frequency of the system is the electrical frequency of the rotor.

16. The system of claim 13, wherein the stator field ratio value is calculated based on the negative-sequence stator current and the field current during normal generator operating conditions.

17. The system of claim 13, wherein an operating electrical value is calculated based on the negative-sequence current of the at least one stator electrical characteristic and a field current of the rotor electrical characteristic; and wherein a restraining electrical value is calculated based on the negative-sequence current of the at least one stator electrical characteristic and a field current of the rotor electrical characteristic.

18. The system of claim 17, wherein the operating electrical value, $I_{OP}$, is calculated according to:

$$I_{OP} = ||I_{2(Nom)}| - N_{SF} \cdot |I_{F(2 \times Nom)}||$$

where $I_2$ corresponds to the negative-sequence current, $N_{SF}$ corresponds to a stator field ratio value, and $I_F$ corresponds to the field current with an adjusted frequency approximately equal to twice the operating frequency of the generator.

19. A non-transitory computer readable medium for protecting an electric power generator comprising instructions, that when executed by a processor, cause the processor to perform operations for determining a fault value, comprising:

receiving a rotor electrical characteristic associated with a rotor of an electric power generator;

receiving at least one stator electrical characteristic associated with at least one stator phase of the electric power generator;

determining a rotor electrical value based on the rotor electrical characteristic during an unbalanced condition;

determining a negative-sequence stator electrical value based on the at least one stator electrical characteristic during the unbalanced condition;

determining a stator-rotor unbalance or differential value, wherein the stator-rotor unbalance or differential value comprises a difference between the determined rotor electrical value and the determined negative-sequence stator electrical value;

determining that the stator rotor unbalance or differential value exceeds a threshold fault value; and reporting a turn fault.

20. The computer readable medium of claim 19, wherein reporting a turn fault comprises:

determining a fault value of the electric power generator based on the determined stator-rotor differential value; and reporting the determined fault value.

21. A method for protecting an electric power generator comprising:

receiving a rotor electrical characteristic associated with a rotor of an electric power generator;

receiving at least one stator electrical characteristic associated with at least one stator phase of the electric power generator;

determining a rotor electrical value based on the rotor electrical characteristic during an unbalanced condition;

determining a negative-sequence stator electrical value based on the at least one stator electrical characteristic during the unbalanced condition;

determining a stator rotor unbalance or differential value, wherein the stator-rotor unbalance or differential value comprises a difference between the determined rotor electrical value and the determined negative-sequence stator electrical value;

determining that the stator rotor unbalance or differential value exceeds a threshold fault value; and reporting a turn fault.

22. The method of claim 21, wherein reporting a turn fault comprises:

determining a turn fault value of the electric power generator based on the determined stator-rotor differential value; and reporting the determined turn fault value.

* * * * *